United States Patent
Wada et al.

(10) Patent No.: US 6,423,192 B1
(45) Date of Patent: Jul. 23, 2002

(54) SPUTTERING APPARATUS AND FILM FORMING METHOD

(75) Inventors: Junichi Wada; Hideto Matsuyama; Tomio Katata; Atsuko Sakata; Koichi Watanabe, all of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/697,442

(22) Filed: Oct. 27, 2000

(30) Foreign Application Priority Data

Oct. 29, 1999 (JP) .............................. 11-310298
Jun. 2, 2000 (JP) ......................... 2000-166059

(51) Int. Cl.[7] .............................. C23C 14/35
(52) U.S. Cl. .............................. 204/192.12; 204/298.06; 204/298.08; 204/298.11; 204/298.17
(58) Field of Search ....................... 204/192.12, 298.06, 204/298.11, 298.08, 298.17

(56) References Cited

U.S. PATENT DOCUMENTS

| | | | |
|---|---|---|---|
| 5,897,752 A | 4/1999 | Hong et al. | 204/192.12 |
| 5,922,180 A | * 7/1999 | Hoshino | 204/298.06 |
| 6,077,403 A | * 6/2000 | Kobayashi et al. | 204/192.12 |

FOREIGN PATENT DOCUMENTS

| | | | |
|---|---|---|---|
| JP | 54-149338 | 11/1979 | C23C/15/00 |
| JP | 62-99461 | 5/1987 | C23C/14/34 |
| JP | 7-305166 | 11/1995 | C23C/14/35 |
| JP | 9-256149 | 9/1997 | C23C/14/35 |
| JP | 10-265949 | 10/1998 | C23C/14/34 |
| JP | 2912181 | 4/1999 | C23C/14/34 |
| JP | 2914644 | 4/1999 | H01L/21/203 |
| JP | 11-100668 | 4/1999 | C23C/14/34 |
| JP | 11-74225 | 5/1999 | H01L/21/285 |

OTHER PUBLICATIONS

A. Sano et al.; "Deposition Characteristics of Cu Film Employing Sustained Self–Sputtering (3)", Extended Abstract No. 27p–Q–4 (The 43rd Spring Meeting) of the Japan Society of Applied Physics and Related Societies, No. 2, p. 747, (1996).

H. Kotani et al.; "Distance dependence of Cu filling characteristics employing self–sputtering mode", Extended Abstract No. 8a–N–2 (The 57th Autumn Spring Meeting) of the Japan Society of Applied Physics, No. 2, p. 642, (1996).

A. Sano et al.; "Deposition Characteristics of Cu Film Employing Sustained Self–Sputtering (2)", Extended Abstract No. 26a–ZQ–4 (The 56th Autumn Meeting) of the Japan Society of Applied Physics, No. 2, p. 607, (1995).

(List continued on next page.)

*Primary Examiner*—Steven H. VerSteeg
(74) *Attorney, Agent, or Firm*—Finnegan, Henderson, Farabow, Garrett, & Dunner, L.L.P.

(57) ABSTRACT

A sputtering apparatus includes a process chamber for accommodating a semiconductor wafer. A susceptor is disposed on the bottom of the interior of the process chamber, and a sputter target is disposed at the top of the process chamber. A cylindrical ion reflecting plate is disposed along the inner wall of the process chamber. A lower grounded component, which forms a path along which electrons are released, is disposed below the ion reflecting plate so as to surround the susceptor. A magnet is disposed behind the target outside the process chamber. Negative potentials are applied to the target and semiconductor wafer, and a positive potential is applied to the ion reflecting plate. The magnet forms a closed magnetic field for trapping electrons in a plasma on the surface of the target, and a divergent magnetic field for directing the electrons in the plasma to the lower grounded component.

20 Claims, 16 Drawing Sheets

OTHER PUBLICATIONS

T. Ichiki et al.; "Copper Film Deposition Using Sustained Self–Sputtering with ICP Ionization", Extended Abstract No. 27p–Q5 (The 43$^{rd}$ Spring Meeting) of the Japan Society of Applied Physics and Related Societies, No. 2, p. 748, (1996).

T. Asamaki et al.; Standard Handbook (The Basis of Thin Film Deposition), Chap. 8, pp. 195–242, (1977).

I. Utsunomiya et al.; "Sustained Self–Sputtering of Copper using DC Magnetron Source", Extended Abstract No. 29a–R–12 (The 40$^{th}$ Spring Meeting) of the Japan Society of Applied Physics and Related Societies, No. 2, p. 393, (1993).

A. Sano et al.; "Deposition Characteristics of Cu Film Employing Sustained Self–Sputtering", Extended Abstract No. 30 p–K–3 (The 43$^{rd}$ Spring Meeting) of the Japan Society of Applied Physics and Related Societies, No. 2, p. 813, (1995).

A. Sano et al.; "Self–Sputtering of Cu Film Employing Highly Ionized Cu Plasma", Advanced Metallization and Interconnect Systems for ULSI Applications, pp. 709–715, (1996).

* cited by examiner

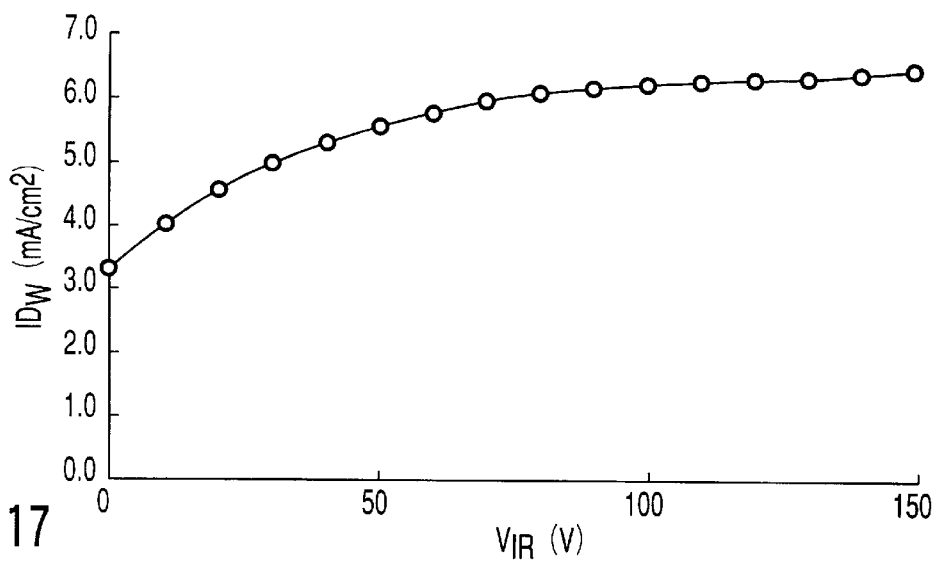
FIG. 17
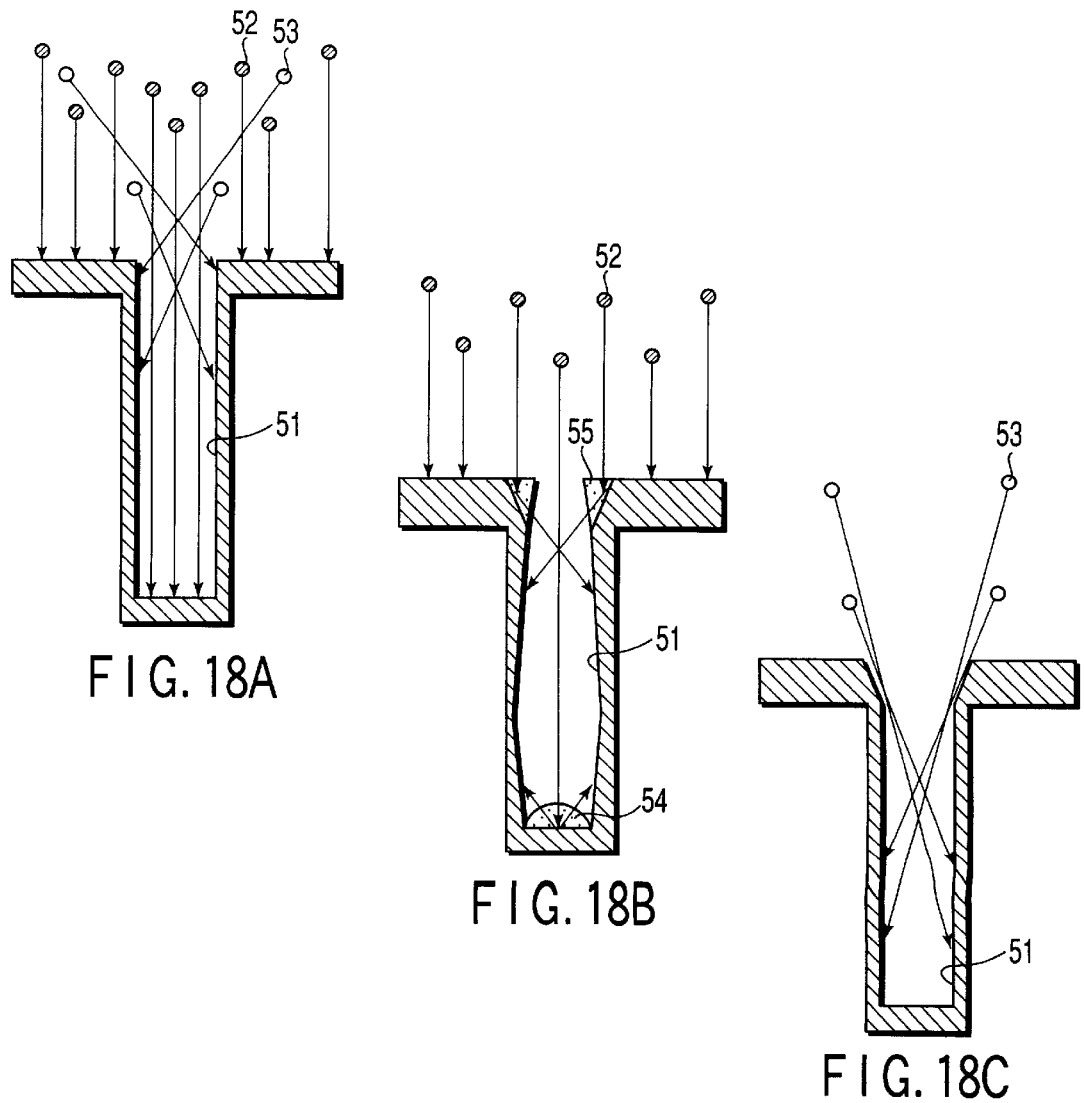
FIG. 18A
FIG. 18B
FIG. 18C

SPUTTERING APPARATUS AND FILM FORMING METHOD

CROSS-REFERENCE TO RELATED APPLICATIONS

This application is based upon and claims the benefit of priority from the prior Japanese Patent Applications No. 11-310298, filed Oct. 29, 1999; and No. 2000-166059, filed Jun. 2, 2000, the entire contents of which are incorporated herein by reference.

BACKGROUND OF THE INVENTION

The present invention relates to a sputtering apparatus and film forming method and, more particularly, to a sputtering apparatus effective for forming an interconnection film made of Al or Cu, a barrier metal film made of TaN or TiN, and a liner film made of Ti or Nb, and a film forming method using this apparatus.

In the semiconductor process, a sputtering apparatus is widely used as a film forming apparatus. One of the reasons for this is that the sputtering apparatus requires a low running cost while providing a high productivity.

As semiconductor devices are recently micro-patterned and highly integrated, the aspect ratio (the ratio of depth to opening diameter) of a contact hole tends to increase. For example, when an interlevel insulating film is to be deposited on an Si substrate with a surface having a diffusion layer and a contact hole to be connected to the diffusion layer is to be formed in this interlevel insulating film, this contact hole has a high aspect ratio. Therefore, for example, when a Ti silicide layer is to be formed on the surface of the diffusion layer, it is not easy to form a thick Ti film on the bottom surface of the contact hole by sputtering. When the inner surface (side and bottom surfaces) of the contact hole is to be covered with a barrier metal film such as a TiN film, or a glue layer for W-CVD, the barrier metal or the like cannot be easily formed on the entire inner surface of the contact hole to a uniform thickness by sputtering.

The Al reflow technique is known as a technique of filling a contact hole with an Al film. Of the Al reflow technique, a 2-step reflow scheme of sequentially forming a liner film, a first Al film, and a second Al film by sputtering has become the mainstream. According to the 2-step reflow scheme, the first Al film is formed by cooling, while the second Al film is formed while heating. When forming the second Al film, Al flows in the contact hole through the first Al film as the diffusion path. Therefore, the first Al film must be formed on the entire inner surface of the contact hole.

A film forming method using the conventional sputtering apparatus has poor step coverage. Accordingly, it is not easy to increase the thickness of the film on the bottom surface of the contact hole, to uniform the thickness of the film on the entire inner surface of the contact hole, or to form the film on the entire inner surface of the contact hole.

Conventionally, an Al interconnection is often used as an LSI interconnection. In recent years, an interconnection structure as a combination of an insulating film with a low dielectric constant and a Cu interconnection has been studied. This is sought for in order to decrease the resistance and increase the reliability of the interconnection, i.e., in order to improve RC delay and improve the EM resistance. Since compounds of Cu that have a high vapor pressure are few, Cu is difficult to process by RIE (Reactive Ion Etching). Accordingly, it is difficult to form an RIE interconnection from Cu. Hence, when forming a Cu interconnection, the damascene process that does not use RIE is the mainstream.

In the damascene process, a metal film is formed by deposition on the entire surface to fill an interconnection groove formed in an interlevel insulating film in advance. After that, an excessive portion of the metal film outside the interconnection groove is removed by CMP (Chemical Mechanical Polishing) to form an interconnection (damascene interconnection) formed of the metal film. In particular, a process of forming a groove and contact hole in an interlevel insulating film in advance and filling the groove and contact hole with a metal film at once, thereby forming an interconnection and plug simultaneously is called a dual damascene process (DD process).

When a Cu interconnection is to be formed by the damascene process, a Cu film is naturally used as the metal film. As Cu tends to diffuse in the interlevel insulating film, Cu in the Cu film diffuses to the Si substrate. Cu diffused to reach the Si substrate forms a deep level in Si. This deep level traps carriers to degrade the element characteristics.

For this reason, when a Cu interconnection is to be formed by the damascene process, a barrier metal film diffusion preventive film) for preventing diffusion of Cu is formed by sputtering on the inner surface of the interconnection groove before the Cu film is deposited. With the DD process, a barrier metal film must also be formed on the inner surface of the contact hole. As the barrier metal film, a TIN film, a TaN film, and the like are widely studied. The barrier metal film is desirably formed uniformly on the entire inner surface of the interconnection groove, or the entire inner surfaces of the interconnection groove and contact hole because of its purpose.

In the DD process for Cu, the interconnection groove and the like must be filled with a Cu film. As a Cu film forming method, electroplating is widely studied. Cu electroplating requires a seed layer for supplying electrons to electroplating solution. The barrier metal film, such as the TaN film, described above however does not function well as a seed layer. For this reason, after the barrier metal film is formed, a seed layer is often formed by sputtering Cu itself as the material of the interconnection. Such a seed layer (Cu seed layer) is desirably formed uniformly on the entire inner surface of the interconnection groove, or the entire inner surfaces of interconnection groove and contact hole because of its purpose.

To meet these requirements, a sputtering apparatus, e.g., a long throw sputtering apparatus or ionization sputtering apparatus, which has an improved sputtering particle directivity is used to form a Ti film, TiN film, TaN film, and Cu seed layer.

FIG. 22 is a schematic view showing a conventional long throw sputtering apparatus. In the long throw sputtering apparatus, the distance between a substrate 81 and target 82 is increased, and an Ar pressure is decreased to suppress gas scattering. This suppresses oblique incident components of the sputtering particles into the contact hole, thereby improving the directivity of the sputtering particles.

FIG. 22 shows a process chamber 83, a magnet 84, a backing plate 85, cooling water paths 86, an insulating member 87, an earth shield 88, a first shield plate 89 to prevent deposition on the other portions (to be referred to as a shield plate), a second shield plate 90, an elevating system 91 of the second deposition preventive plate 90, an electrostatic chucking plate 92, a susceptor 93 (worktable), a coolant 94, a DC voltage source 95 for applying a voltage to the target 82, and a pair of ring-like magnets 84a and 84b.

A film forming method using the conventional long throw sputtering apparatus has the following problems more specifically, the shape of the formed film becomes asymmetric at the end of the substrate. A metal film is accordingly difficult to form uniformly, and the coverage is poor.

In the ionization sputtering apparatus, an RF (Radio-Frequency) power is introduced to an induction coil attached between the target and substrate, thereby generating a high-density plasma of Ar gas supplied into the process chamber. The sputtering particles are ionized in the high-density plasma, and a negative voltage is applied to the substrate, thereby improving the directivity of the sputtering particles.

The film forming method using the conventional ionization sputtering apparatus has the following problems. During film formation, Ar as the sputter gas is also ionized in addition to the sputtering particles. Hence, ionized sputter particles and Ar are attracted to the substrate. The Ar ions attracted to the substrate collide against the substrate. This collision transforms the kinetic energy of Ar ions into heat to increase the substrate temperature.

Al and Cu are metals that tend to agglomerate easily. The higher the substrate temperature, the more likely agglomeration occurs. If an Al or Cu film is formed by the ionization sputtering apparatus, the Al or Cu film agglomerates and is separated easily. Therefore, if the first Al film in the 2-step reflow scheme of Al is formed by using the ionization sputtering apparatus, it causes agglomeration and the diffusion path for Al fluidization disappears, so the contact hole cannot be filled with the second Al film. If the Cu seed layer in electroplating is formed by using the ionization sputtering apparatus, it causes agglomeration and electric conduction for Cu plating cannot be obtained, so the contact hole cannot be filled with a Cu film by electroplating.

Another example of the sputtering apparatus having Cu directivity utilizes self-sustained plasma of Cu. With Cu, sputtered Cu is ionized under specific voltage, current, and magnetic field conditions even when supply of Ar serving as the sputter gas is stopped. Ionized Cu itself collides against the target to force out Cu particles, thereby sustaining plasma.

This self-sustained plasma is not limited to Cu but occurs with other metals as well. Since Cu is a metal that tends to cause self-sustained plasma particularly easily, sputtering by means of self-sustained plasma of Cu has conventionally long been studied (Asamaki: Basic Thin Film Fabrication (third edition) (THE NIKKAN KOGYO SHINBUN. LTD), pp. 195–242, Sano et al: Extended Abstract (The 40th Spring Meeting, 1993) of The Japan Society of Applied Physics and Related Societies, No. 2, p. 393, and Horiike et al: Jpn. Pat. Appln. No. 5-257512 (Japanese Patent No. 2,914,644, Jpn. Pat. Appln. KOKAI Publication No. 7-94413 (Apr. 7, 1995))).

Sufficient directivity cannot be obtained with self-sustained sputtering of Cu alone, and if the contact hole has an aspect ratio of 3 or more, the step coverage becomes poor. Therefore, a sputtering apparatus as a combination of self-sustained sputtering and a scheme for increasing the distance between the sputter target and substrate, as in long throw sputtering described above, has been studied (Horiike et al: Jpn. Pat. Appln. No. 8-91278 (Jpn. Pat. Appln. KOKAI Publication No. 9-256149 (Sep. 9, 1997)), and Kotani et al: Extended Abstract (The 57th Autumn Meeting, 1996) of The Japan Society of Applied Physics and Related Societies, No. 2, p. 642).

With a sputtering apparatus of this type, since self-sustained sputtering is utilized, Ar gas need not be supplied, and scattering of sputter particles caused by Ar gas does not occur at all. However, even if self-sustained sputtering and long throw sputtering are combined, the asymmetry of the shape of the formed film, which is the fundamental problem of long throw sputtering, is not solved, and becomes rather conspicuous as gas sputtering does not occur. It is therefore practically difficult to form a Cu film on an Si substrate with a diameter of 200 mm or more by using a sputtering apparatus utilizing conventional self-sustained sputtering and long throw sputtering.

Furthermore, in the sputtering apparatus utilizing self-sustained plasma of Cu, it has been studied to apply a DC negative voltage to the substrate so that Cu ions are attracted to the substrate with a good directivity (A. Sano et al: Advanced Metallization and Interconnect Systems for ULSI Applications in 1995, pp. 709–715, and Tsukada et al: Jpn. Pat. Appln. No. 53-57812 (Jpn. Pat. Appln. KOKAI Publication No. 54-149338 (Nov. 22, 1979)), Sano et al: Extended Abstract (The 42nd Spring Meeting, 1995) of The Japan Society of Applied Physics and Related Societies, No. 2, p. 813, Sano et al: Extended Abstract (The 56th Autumn Meeting, 1995) of The Japan Society of Applied Physics and Related Societies, No. 2, p. 607, and Sano et al: Extended Abstract (The 43rd Spring Meeting, 1996) of The Japan Society of Applied Physics and Related Societies, No. 2, p. 747).

In self-sustained sputtering, when the directivity of Cu ions is to be increased by applying a DC negative voltage to the substrate, ions that are attracted to the substrate by the DC negative voltage are only Cu ions. Hence, unlike in the case using the ionization sputtering apparatus, the substrate temperature is not increased by Ar ions, and an increase in substrate temperature can be suppressed to the necessary minimum level.

The sputtering apparatus of this type has the following problems. In self-sustained sputtering of Cu, many Cu ions are restrained near the target by the target voltage and the magnetic field, and the number of free ions to be attracted by the negative voltage applied to the substrate is small. The Cu ions accordingly do not have large effect on film formation, and excellent step coverage cannot be obtained. If Cu ions near the target are to be further attracted to the substrate, the target current density decreases, and self-plasma may not be sustained.

In self-sustained sputtering of Cu, it has been proposed to ionize Cu neutral particles in order to increase the number of Cu ions, so that more Cu ions are attracted to the substrate upon application of the DC negative voltage to the substrate. More specifically, an attempt has been proposed to introduce an RF power to the induction coil between the target and substrate so as to form a high-density plasma, so that Cu neutral particles are ionized in the high-density plasma (Horiike et al: Jpn. Pat. Appln. No. 8-91728, and Itsuki et al: Extended Abstract (The 43rd Spring Meeting, 1996) of The Japan Society of Applied Physics and Related Societies, No. 2, p. 748).

Different from ionization sputtering of supplying an inert gas such as Ar, self-sustained sputtering is performed in a high vacuum. For this reason, even when an AC current with a very high frequency is introduced, it is difficult to ionize Cu neutral particles traveling in vacuum. Therefore, even when self-sustained sputtering and ionization of Cu neutral particles are combined, a sufficiently high-density plasma cannot be formed, i.e., the number of Cu ions contributing to formation of the Cu film cannot be increased, and a practical sputtering apparatus is difficult to realize.

Self-sustained sputtering has a drawback in that its film formation rate is excessively high. To improve the film quality, it is generally effective to increase the film formation rate. If, however, the film formation rate is excessively high, a thin film is difficult to form with good controllability, as described in Jpn. Pat. Appln. No. 5-257512.

In most of the recent sputtering apparatuses, a magnet is arranged above the target to increase the plasma density. It is difficult to increase the plasma density on the entire surface of the target, and in most cases, a high-density plasma region is shifted to sputter the entire surface of the target. In this case, the magnet above the target is often rotated. An increase in rotational speed of the magnet is limited. If the film formation rate is excessively high, sputtering is ended while the rotational number is still small. Consequently, variations in film thickness distribution within the substrate surface may increase, or the controlled film thickness may vary, posing a problem in the production.

In self-sustained sputtering, the film formation rate tends to increase because discharge cannot be sustained unless a high target voltage and large current, and a high magnetic flux density of the target surface are maintained. According to Jpn. Pat. Appln. No. 53-57812, to continue self-sustained sputtering of Cu, the target current density must be 130 mA/cm$^2$ or more. According to Jpn. Pat. Appln. No. 5-257512, to form a Cu film with a thickness of 0.5 $\mu$m to 1 $\mu$m by self-sustained sputtering of Cu at a controllable film formation rate, the target current density must be 100 mA/cm$^2$ or less. Although these two numerical values are contradictory, it may depend on the magnetic flux density on the target surface, the target shape, and the like.

Jpn. Pat. Appln. No. 5-257512 does not describe the lower limit of the target current density necessary for sustaining self-plasma. If the target current density is merely decreased in order to decrease the film formation rate, it becomes close to the lower limit of self-sustained discharge, as described in Jpn. Pat. Appln. No. 53-57812, and discharge may be interrupted and thus become unstable.

In the recent Cu damascene process, as described above, the main stream is the method of covering the inner surfaces of the interconnection groove and contact hole with a Cu seed layer by sputtering and thereafter filling the interconnection groove and contact hole with a Cu film by electroplating. In this case, a plating solution must enter the interconnection groove and contact hole. Therefore, the openings of the interconnection groove and contact hole should not be narrowed by the Cu seed layer.

Since the integration degree of the recent LSIs increases, many LSIs have interconnection grooves and contact holes with widths and diameters of 0.3 $\mu$m or less. If a thick Cu seed layer is formed on the inner surfaces of these fine interconnection groove and contact hole, the openings of the interconnection groove and contact hole become narrow. Thus, the Cu seed layer must be formed thin, and more specifically, preferably has a thickness of 0.3 $\mu$m or less.

In the target current density region with a target current density of 100 mA/cm$^2$ or less, disclosed in Jpn. Pat. Appln. No. 5-257512, which is equal to or more than the lower limit that can sustain self-discharge, since the film formation rate is high and self-sustained discharge is not stable, a thin seed layer described above is difficult to form.

In self-sustained sputtering of Cu, a method has been proposed of applying a positive voltage to around the susceptor, thereby controlling the ionization energy and the directivity of ions (U.S. Pat. No. 5,897,752 corresponding to Jpn. Pat. Appln. KOKAI Publication No. 11-100668). According to the content disclosed in this reference, a component for applying the positive voltage becomes an anode to be electrically coupled with the cathode, so the directivity of the ions is difficult to control, as will be described later in the embodiments of the present invention. Accordingly, this method cannot solve the problem of poor step coverage described above.

Jpn. Pat. Appln. No. 7-40182 (Japanese Patent No. 2,912, 181, Jpn. Pat. Appln. KOKAI Publication No. 8-239761 (Sep. 17, 1996)) shows a structure in which the potential of the shield or the inner wall of a vacuum vessel is set at a positive value to prevent inert gas ions from attaching to the inner wall of the vacuum vessel. With the disclosed contents alone, however, a component for applying the positive voltage becomes an anode to be electrically coupled with the cathode, so the directivity of the inert gas ions is difficult to control, i.e., the inert gas ions are difficult to prevent from attaching to the inner wall of the vacuum vessel.

As described above, sputtering apparatuses, e.g., a long throw sputtering apparatus and an ionization sputtering apparatus, which sustaining self-plasma have been conventionally known. All the sputtering apparatuses have a problem in coverage (asymmetry of the shape of the formed film at the substrate end and the step coverage at the contact hole). Furthermore, in the sputtering apparatus sustaining self-plasma, the film formation rate is excessively high.

BRIEF SUMMARY OF THE INVENTION

The present invention has been made in consideration of the above situations, and has as its object to provide a sputtering apparatus and a film forming method that enable film formation with good coverage.

According to a first aspect of the present invention, there is provided a sputtering apparatus comprising:

a vacuum process chamber configured to accommodate a substrate to be processed;

a support member configured to support the substrate in the process chamber;

a gas supply system configured to supply a process gas into the process chamber;

an exciting system configured to excite the process gas to generate a plasma by causing discharge in the process chamber;

a sputter target disposed in the process chamber so as to oppose the substrate and to be collided by ions in the plasma to emit a film forming material;

a first negative biasing section configured to apply a first negative potential to the target;

a second negative biasing section configured to apply a second negative potential to the substrate;

an ion reflecting plate disposed in the process chamber so as to surround a space between the substrate and the target;

a positive biasing section configured to apply a positive potential to the ion reflecting plate;

a conductive component disposed in the process chamber to form a path along which electrons are released from the plasma; and a magnetic field forming system configured to form in the process chamber a closed magnetic field for trapping electrons in the plasma on a surface of the target and a divergent magnetic field for directing the electrons in the plasma to the conductive component.

According to a second aspect of the present invention, there is provided a sputtering apparatus comprising:

a vacuum process chamber configured to accommodate a substrate to be processed;

a support member configured to support the substrate in the process chamber;

a gas supply system configured to supply a process gas into the process chamber;

an exciting system configured to excite the process gas to generate a plasma by causing discharge in the process chamber;

a sputter target disposed in the process chamber so as to oppose the substrate and to be collided by ions in the plasma to emit a film forming material;

a first negative biasing section configured to apply a first negative potential to the target;

a second negative biasing section configured to apply a second negative potential to the substrate;

an ion reflecting plate disposed in the process chamber so as to surround a space between the substrate and the target;

a positive biasing section configured to apply a positive potential to the ion reflecting plate;

a conductive component disposed in the process chamber to form a path along which electrons are released from the plasma; and a control mechanism configured to set an electric resistance between the target and the ion reflecting plate to be higher than that between the target and the conductive component when the plasma is formed and the ion reflecting plate and the conductive component are grounded.

According to a third aspect of the present invention, there is provided a film forming method using the apparatus according to claim 1, comprising the steps of:

accommodating the substrate to be processed in the process chamber and supporting the substrate on the support member;

supplying the process gas into the process chamber;

applying the positive potential to the ion reflecting plate so that the ions of a film forming material are reflected and guided to the substrate;

exciting the process gas to generate the plasma by causing discharge in the process chamber;

applying the first negative potential to the target so that ions in the plasma collide against the target to emit the film forming material;

exciting the film forming material with the electrons in the plasma trapped by the closed magnetic field to ionize at least part of the film forming material;

flowing the electrons in the plasma with the divergent magnetic field to the conductive component and releasing the electrons from the process chamber through the conductive component, so that the conductive component serves as an anode with respect to the target; and forming a film on the substrate with the film forming material while attracting the ions of the film forming material to the substrate by applying the second negative potential to the substrate.

According to the present invention, even ions that cannot come directly incident on a substrate to be processed can be reflected by an ion reflecting plate to come incident on the substrate. In contrast to this, according to the prior art, ions that cannot come directly incident on the substrate disappear in the grounding member and cannot contribute to film formation. Therefore, according to the present invention, the number of ions contributing to film formation can be increased, and film formation can be performed with better coverage than in the prior art.

The sputtering apparatus described in Jpn. Pat. Appln. No. 7-40182 is similar to the sputtering apparatus of the present invention as it has a component charged with a positive potential in it. According to Jpn. Pat. Appln. No. 7-40182, a portion charged with a positive potential is formed in the sputtering apparatus to prevent dust or mixing of impurities there.

According to the content described in Jpn. Pat. Appln. No. 7-40182, a component which applies a positive voltage is likely to become an anode to be electrically coupled with the cathode, and accordingly the directivity of the ions is difficult to control, as will be described later in the embodiments of the present invention. Jpn. Pat. Appln. No. 7-40182 does not disclose a mechanism that can apply a negative voltage to the substrate, and ions produced from the target material cannot be attracted to the substrate. Due to these differences in arrangement, the sputtering apparatus described in Jpn. Pat. Appln. No. 7-40182 cannot improve the step coverage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 17 is a graph showing the dependency of a substrate current density $ID_W$ on the voltage $V_{IR}$ of the ion reflecting plate;

FIGS. 18A, 18B, and 18C are views for explaining the reason why the step coverage of a Cu film is improved by attracting Cu ions to a substrate during self-sustained sputtering of Cu;

DETAILED DESCRIPTION OF THE INVENTION

Figure 1:
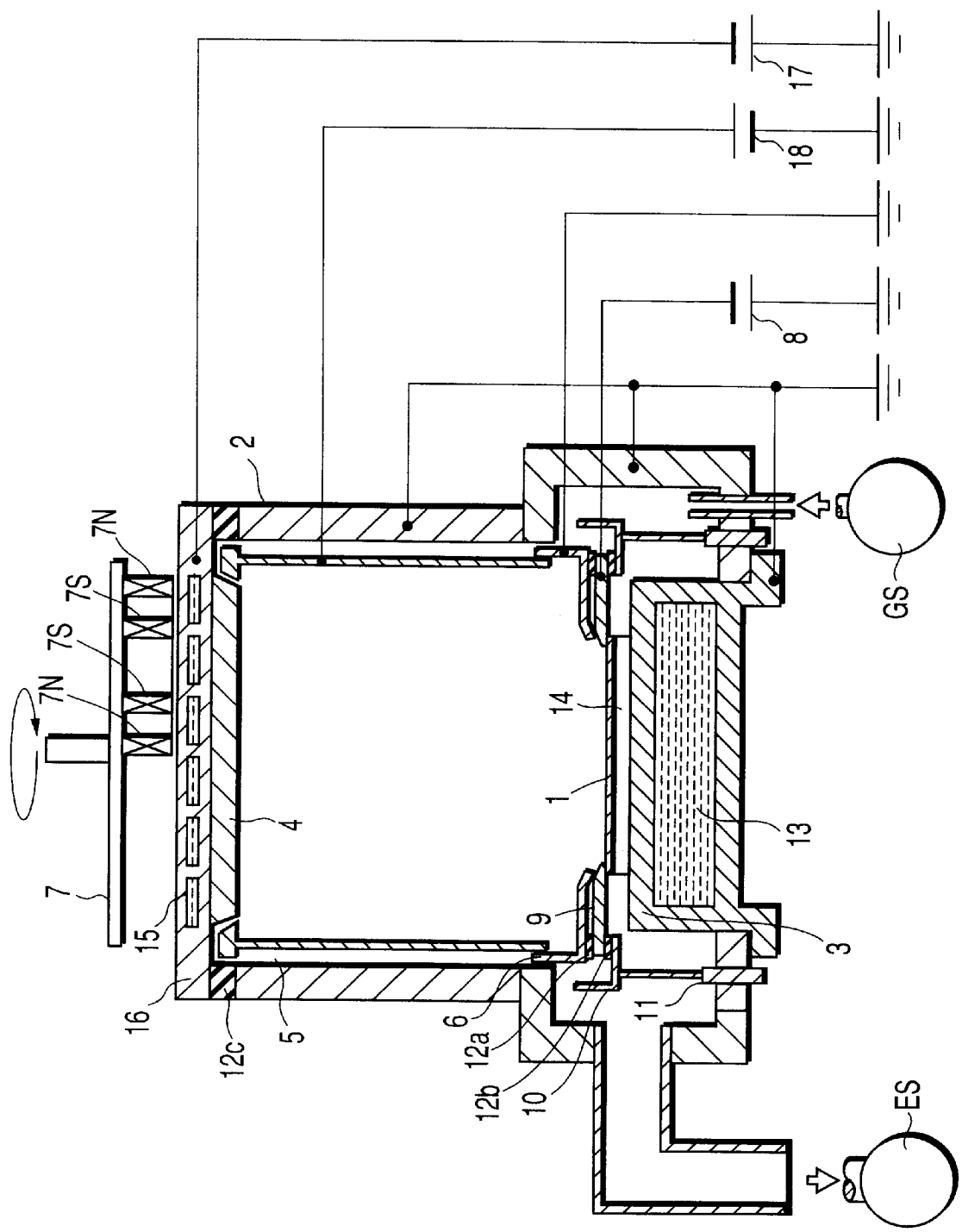
FIG. 1 is a view showing a sputtering apparatus according to the first embodiment of the present invention.

The preferred embodiments of the present invention will be described with reference to the accompanying drawing. In the following description, constituent elements having substantially the same functions and arrangements are denoted by the same reference numerals, and a repetitive description will be made only when it is necessary.
(First Embodiment)

FIG. 1 is a view showing a sputtering apparatus according to the first embodiment of the present invention.

This sputtering apparatus includes a vacuum process chamber 2 for accommodating a substantially circular semiconductor wafer, i.e., a substrate 1 to be processed, to form a film on it by sputtering. A susceptor (worktable) 3 with a circular support surface is disposed to form the bottom of the process chamber 2 and to support the substrate 1. A circular sputter target (to be merely referred to as a target hereinafter) 4 is disposed in the upper portion of the process chamber 2 to oppose the susceptor 3. A cylindrical ion reflecting plate 5 is disposed along the inner wall of the process chamber 2. A grounded circular ring-like conductive component, i.e., a lower grounded component 6, is disposed in the process chamber 2 to be located below the ion reflecting plate 5. A magnet 7 is disposed behind the target 4 and outside the process chamber 2. These members are accommodated in a module (not shown).

The process chamber 2 is connected to a gas supply system GS for supplying a process gas such as Ar, and an exhaust system ES for exhausting the gas from the process chamber 2. The process chamber 2 is also connected to a transfer chamber (not shown), incorporating a transfer system, through a gate valve. The substrate 1 is transferred to and from the susceptor 3 by this transfer system. More specifically, with this transfer chamber, the substrate 1 which has undergone processes such as film formation, etching, and the like in a separate module connected to the transfer chamber can be transferred in vacuum, and can be continuously processed in this module.

A circular ring-like clamp 9 is disposed around the susceptor 3 to fix the substrate 1 in tight contact with the susceptor 3. The clamp 9 is attached to an elevator 11 through a support 10, and is vertically driven by the elevator 11. The clamp 9 is connected to a first DC voltage source 8 which can apply a DC negative voltage, necessary for attracting ions to the substrate 1, to the substrate 1. The clamp 9 and lower grounded component 6 are insulated from each other by a first insulating member 12a, and the clamp 9 and support 10 are insulated from each other by a second insulating member 12b.

The substrate 1 is transferred onto the susceptor 3 and placed on it, and after that the support 10 is moved downward by the elevator 11. Thus, the clamp 9 comes into contact with the end of the substrate 1. Hence, a negative voltage can be applied to the substrate 1, and the tight contact of the substrate 1 and susceptor 3 can be enhanced. When the DC negative voltage is to be applied from the clamp 9 to the substrate 1, the surface of the substrate 1 must be conductive.

When a metal film, e.g., a Cu film or Al film, which tends to agglomerate when the substrate temperature increases upon ion collision, is to be formed, a susceptor 3 with a substrate cooling function is desirably used, as shown in FIG. 1. FIG. 1 shows a structure in which a coolant 13 is flowed through the susceptor 3 to cool the substrate 1. With this structure, the clamp 9 can enhance the tight contact of the substrate 1 and susceptor 3, so that the substrate 1 can be cooled effectively.

In order to cool the substrate 1 more effectively, an electrostatic chucking plate 14 may be further installed on the susceptor 3, as shown in FIG. 1. This can enhance the tight contact of the substrate 1 and susceptor 3 more than in a case wherein only the clamp 9 is provided, so that the substrate 1 can be cooled more effectively.

The target 4 is supported by a backing plate 16 (upper wall of the chamber) having cooling water paths 15, and is cooled from its rear surface. The backing plate 16 is insulated from the side wall of the process chamber 2 by a third insulating member 12c. The target 4 is connected to a second DC voltage source 17. The second DC voltage source 17 serves to apply to the target 4 a DC negative voltage which is necessary for sputtering, and can be controlled by a power, voltage, or current.

The ion reflecting plate 5 is a component which comes closest to the target 4 in the process chamber 2. The shortest distance between the ion reflecting plate 5 and target 4 is set to be 1 mm to 5 mm. After plasma discharge, many ions exist near the target 4. These ions tend to be easily adsorbed by the grounded component. When ions are adsorbed by the grounded component, the gathering ratio of the free ions to the substrate 1 decreases. This inconvenience can be solved by selecting the ion reflecting plate 5 as a component that comes closest to the target 4, as in this embodiment. The ion reflecting plate 5 need not necessarily be a component that comes closest to the target 4, as will be described later. The ion reflecting plate 5 is connected to a third DC voltage source 18, so that a positive voltage necessary for reflecting the ions is applied to the ion reflecting plate 5.

The magnet 7 is comprised of a pair of S- and N-pole magnets 7S and 7N. The magnet 7 desirably forms a closed magnetic field for trapping electrons in the plasma on the surface of the target 4, and a divergent magnetic field for directing electrons in the plasma to the lower grounded component 6 in an embodiment to be described later. The magnet 7 can be rotated by a rotational system (not shown). Thus, a region with a strong magnetic field intensity can be rotated so that the erosion region of the surface of the target 4 becomes large.

The gas supply system GS includes a regulated valve, flow rate adjustment unit, and valve (not shown), and can supply at least one type of gas into the process chamber 2.

A method of forming a Cu film by using the sputtering apparatus with the above arrangement will be described. In this method, the target 4 is mainly made of Cu.

First, the interior of the process chamber 2 is exhausted to a predetermined pressure by an exhaust system, and a small amount of Ar gas is supplied into the process chamber 2 by the gas supply system GM. The second DC voltage source 17 introduces a power necessary for discharge to the target 4 in order to cause discharge, thereby generating an Ar gas plasma. Immediately after this, the valve is closed to stop supply of the Ar gas, and self-sustained plasma of Cu follows. When Ar ions collide against the target 4, the target 4 emits Cu as a film forming material. Emitted Cu is excited by electrons trapped near the surface of the target 4 by the magnetic field, and is ionized. After the supply of the Ar gas is stopped, ionized Cu itself collides against the target 4 to cause the target 4 to emit Cu. This Cu collision and emission are repeated, so that Cu self-plasma can be sustained.

The first DC voltage source 8 applies a negative voltage to the substrate 1 through the clamp 9. Consequently, part of Cu ions emitted from the target 4 is accelerated toward the substrate 1 and can come incident on its surface substantially vertically. In other words, Cu sputtering with a high directivity can be performed. In this state, however, the number of Cu ions is not sufficient, and the step coverage cannot be improved.

In the first embodiment, during film formation, the third DC voltage source 18 applies a positive voltage to the ion reflecting plate 5. Consequently, of Cu ions emitted from the target 4, those flying toward the side wall of the process chamber 2 are reflected by the ion reflecting plate 5 and accelerated toward the substrate 1. In other words, even Cu ions that were not emitted to directly come incident on the substrate 1 can be reflected by the ion reflecting plate 5 to come incident on the substrate 1.

Figure 22:
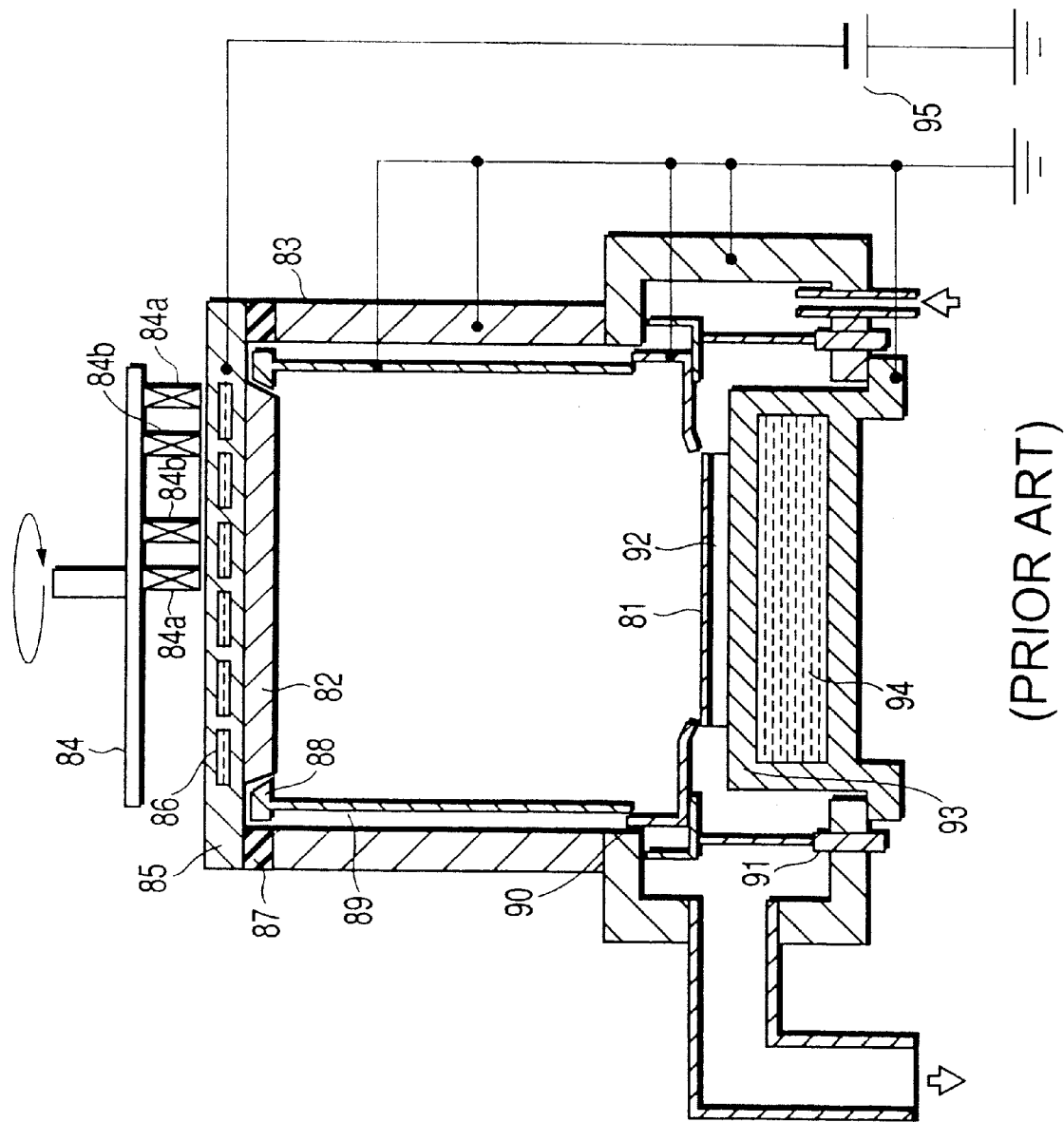
FIG. 22 is a view showing a conventional long throw sputtering apparatus.

In the conventional sputtering apparatus shown in FIG. 22, Cu ions flying toward the side wall of the process chamber 83 collide against the grounded first and second shield plates 89 and 90 and disappear, so they do not contribute to film formation. Therefore, with the sputtering apparatus shown in FIG. 1, the number of Cu ions coming incident on the surface of the substrate 1 substantially vertically can increase more than that with the conventional sputtering apparatus shown in FIG. 22. As a result, coverage (asymmetry of the shape of the formed film at the end of the substrate and step coverage on the contact hole) on the substrate surface can be improved. Step coverage on the contact hole will be described in detail in the second embodiment.

Modifications of the first embodiment will be described.

Figure 2:
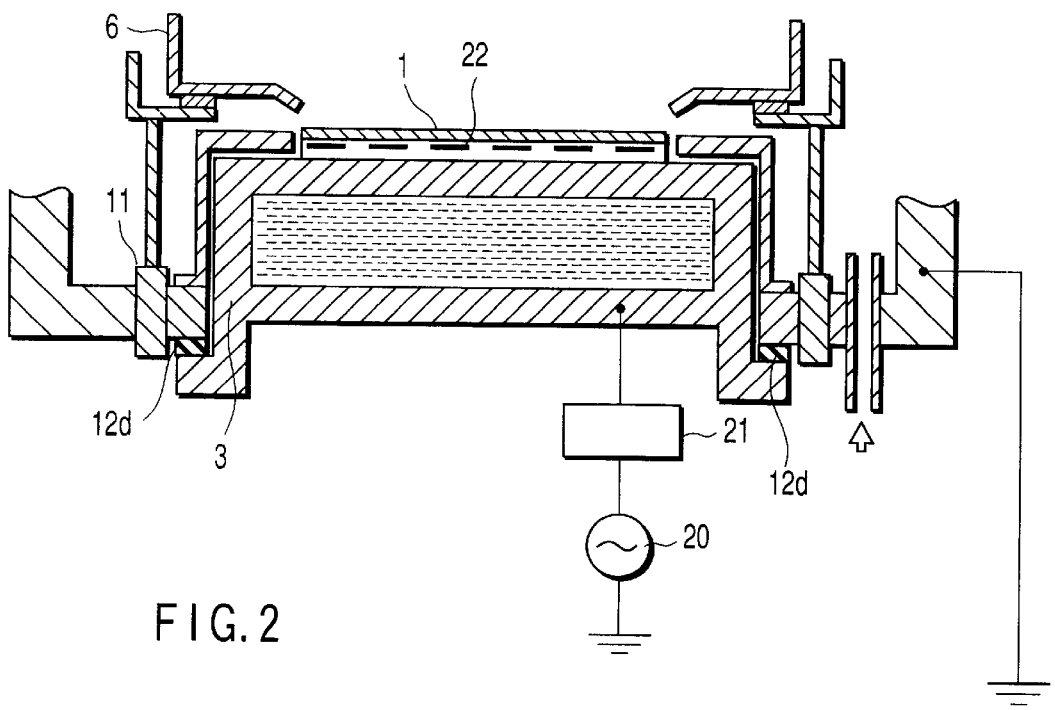
FIG. 2 is a view for explaining the first modification of the first embodiment.

As a mechanism for attracting ions to the substrate 1, the first embodiment shows a mechanism which applies a DC negative voltage to the substrate 1 by using the clamp 9. Alternatively, as shown in FIG. 2, a mechanism can be used in which an RF (Radio-Frequency) power is introduced from an RF power supply 20 to the susceptor 3 through a matching unit 21, thereby applying a negative voltage to the substrate 1. In this case, when the frequency of the RF power is appropriately selected, electrons with a smaller mass than that of ions can be accumulated on the surface of the substrate 1 to bias it in a negative potential (self DC negative voltage). FIG. 2 shows electrostatic chucking electrodes 22 and a fourth insulating member 12d. The electrostatic chucking electrodes 22 are connected to a DC power supply (not shown).

Figure 3:
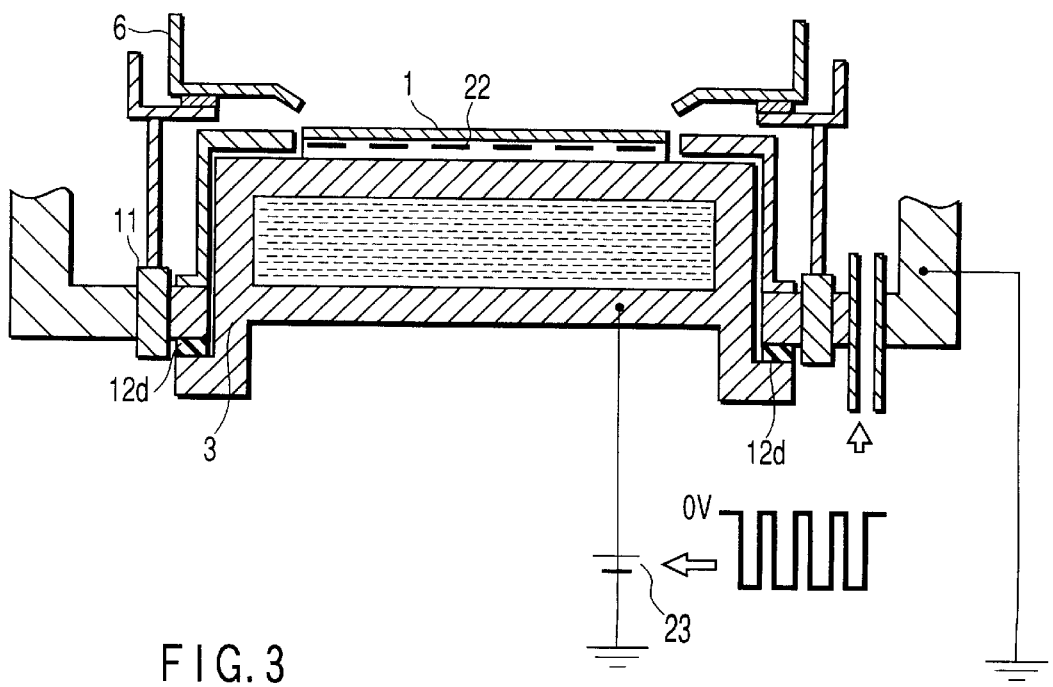
FIG. 3 is a view for explaining the second modification of the first embodiment.

As shown in FIG. 3, a mechanism may be used in which a DC negative voltage with a pulsed waveform is applied to the susceptor 3 by a pulsed DC negative voltage source 23 to bias the surface of the substrate 1 to a negative potential. In this case, different from the case shown in FIG. 2 in which an RF power is introduced, no matching unit need be connected, and the cost of the apparatus can be reduced.

With the mechanism shown in FIG. 2 for introducing the RF power, or the mechanism shown in FIG. 3 for applying the pulsed DC negative voltage, the following advantages can be obtained. Since the substrate 1 is held by the electrostatic chucking electrodes 22, the clamp 9 need not be brought into direct contact with the surface of the substrate 1, and the dust can be decreased. Although the susceptor 3 to be connected to the RF power supply 20 or 23 must be conductive, even if the surface of the substrate 1 is an insulator, it can be biased to a negative potential, different from a case employing a mechanism using the clamp 9.

Figure 4:
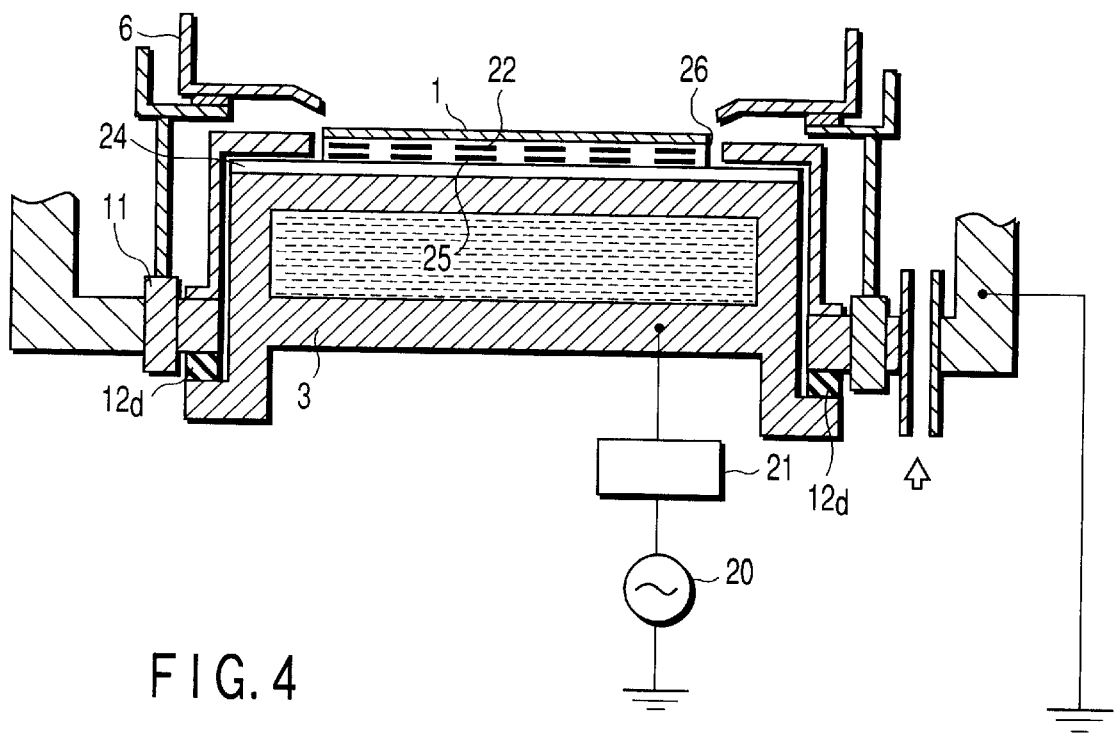
FIG. 4 is a view for explaining the third modification of the first embodiment.

When a film made of a refractory metal such as Ti, Ta, W, or Nb, or of a nitride of the refractory metal is to be formed, a heating system for heating the substrate 1 can be provided. FIG. 4 shows the main part of a sputtering apparatus with such a heating system. More specifically, a lower member 24 made of a material with a low thermal conductivity is disposed on the susceptor 3, and an upper member 26 made of a material with a high thermal conductivity and having electrostatic chucking electrodes 22 and heater electrodes 25 in it is disposed on the lower member 24. This heating mechanism can heat the substrate 1 in tight contact with the upper member 26, so that the heating efficiency of the substrate 1 can be increased. Therefore, the film density can be increased easily by heating.

The magnetic flux densities of the S- and N-pole magnets 7S and 7N of the magnet 7 toward the target may be different from each other. Then, the region where electrons are to be trapped can be deformed, and free ions which are not restrained by the magnetic field and target voltage and emitted from the target 4 can be increased in the plasma. Therefore, the number of ions of the target material which are attracted by the negative voltage applied to the substrate 1 can be further increased.

Figure 5:
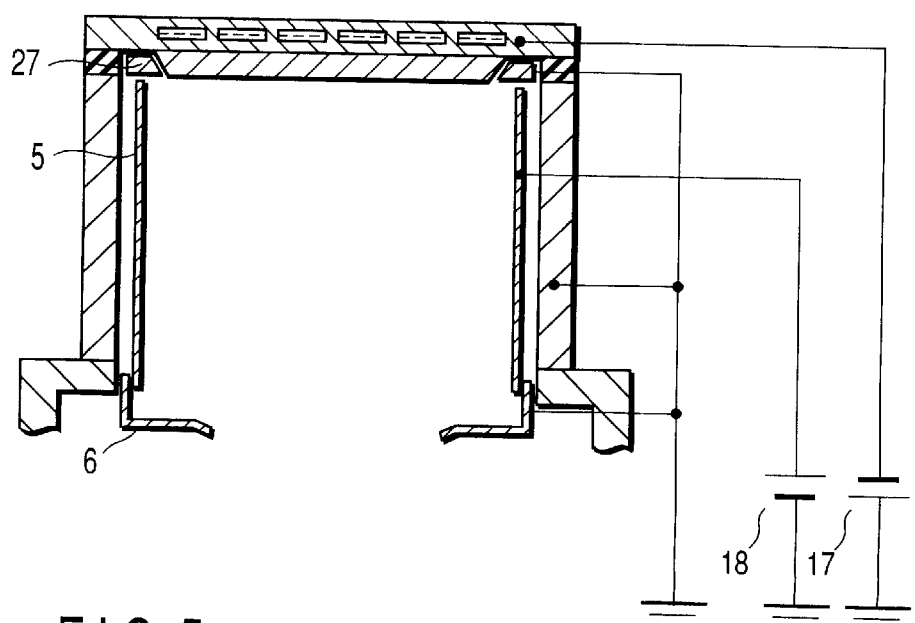
FIG. 5 is a view for explaining the fourth modification of the first embodiment.

In this embodiment, the component which comes closest to the target 4 in the process chamber 2 is the ion reflecting plate 5. Alternatively, the upper portion of the ion reflecting plate 5 may be replaced with a grounded earth shield 27, as shown in FIG. 5, so that arc discharge in the gap between the target 4 and ion reflecting plate 5 is prevented. In this case, the area of the earth shield 27 to be exposed to the plasma is preferably minimized as much as possible.

Figure 6:
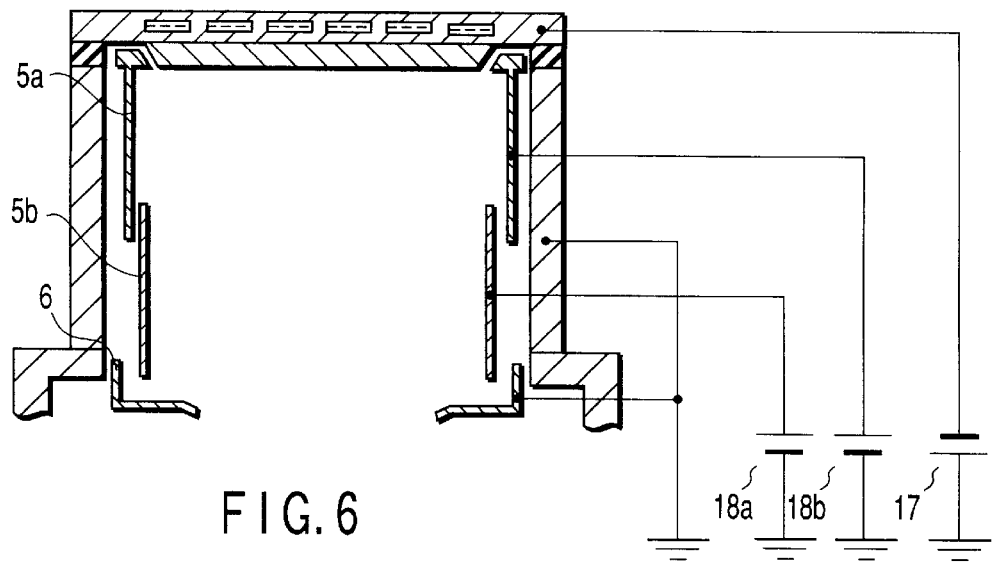
FIG. 6 is a view for explaining the fifth modification of the first embodiment.

In this embodiment, the number of ion reflecting plates is one. Alternatively, as shown in FIG. 6, the ion reflecting plate 5 may be divided into two ion reflecting plates 5a and 5b, and the DC voltage source 18 may be divided into two DC voltage sources 18a and 18b, so that positive voltages can be respectively applied to the two ion reflecting plates 5a and 5b. In this manner, when the number of ion reflecting plates is increased and the positive voltages to be applied to the respective ion reflecting plates are adjusted, the direction of ions coming incident on the substrate can be adjusted easily. More specifically, the film on the entire inner surfaces of the interconnection groove and contact hole can be made thicker easily, and the thickness of the film on the side surfaces of the interconnection groove and contact hole can be made larger than that of the film on the bottom surface of the groove.

According to the studies made by the present inventors, to increase ions of the target material by the ion reflecting plate, it is effective to increase the target current density. When the target current density is increased, however, the film formation rate becomes excessively high. In this case, the distance between the target and substrate may be increased.

A structure and method for applying a positive voltage to the ion reflecting plate, which are preferable in obtaining the effect of the present invention, will be described.

Figure 7A:
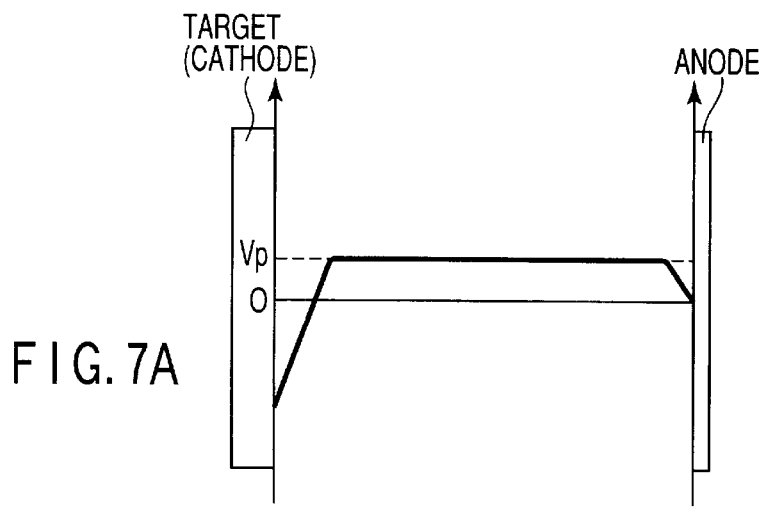
FIGS. 7A and 7B are views showing the distributions of the plasma potential in a conventional sputtering apparatus and in a sputtering apparatus having a component, near a target, to which a positive voltage is applied, respectively.

When a negative voltage is applied to the target by the conventional sputtering apparatus to cause discharge, an ion current flows through the target serving as the cathode, and an electron current flows through the grounded component near the target serving as the anode. FIG. 7A shows a potential distribution obtained in this case between the cathode and anode.

Figure 7B:
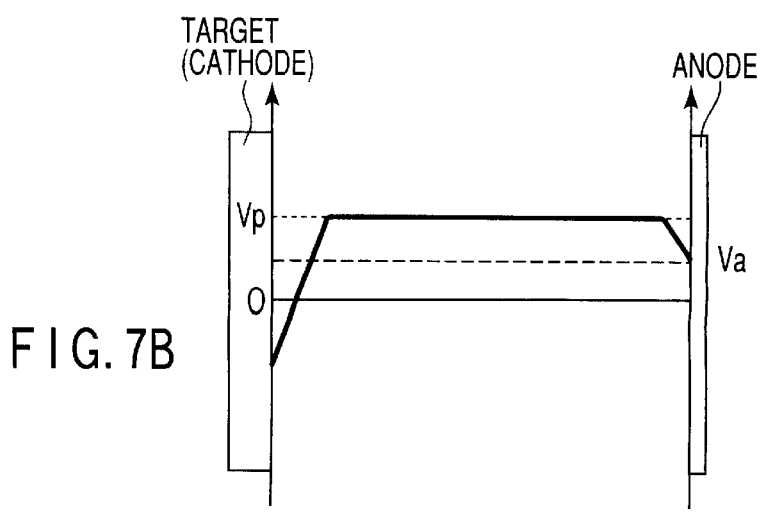

If a component applied with a positive voltage exists near the target, electrons in the plasma are attracted by the electrostatic force of this positive-voltage component, and the positive-voltage component becomes the anode. FIG. 7B shows a potential distribution obtained in this case between the cathode and positive-voltage component. As is apparent from comparison with FIG. 7A, FIG. 7B is different from FIG. 7A only in that the potential distribution is shifted in the positive direction by a positive voltage Va applied to the positive-voltage component. In this case, the potential of the positive-voltage component as the anode is lower than the plasma potential, in the same manner as in the conventional sputtering apparatus, and a direction change in that flying ions are reflected by the positive-voltage component and are directed to the substrate does not occur. In other words, ions are adsorbed to disappear in the same manner as with the grounded component of the conventional sputtering apparatus. Therefore, the sputtering apparatus with a potential distribution as shown in FIG. 7B cannot change the ion directionality to increase the number of ions reaching the substrate.

According to the present invention, the distribution of electrons in the plasma is controlled by using an unbalance magnet. An unbalance magnet is comprised of a pair of magnets with S and N poles directed to the target, in which the S and N poles have different magnetic flux densities.

Figure 8:
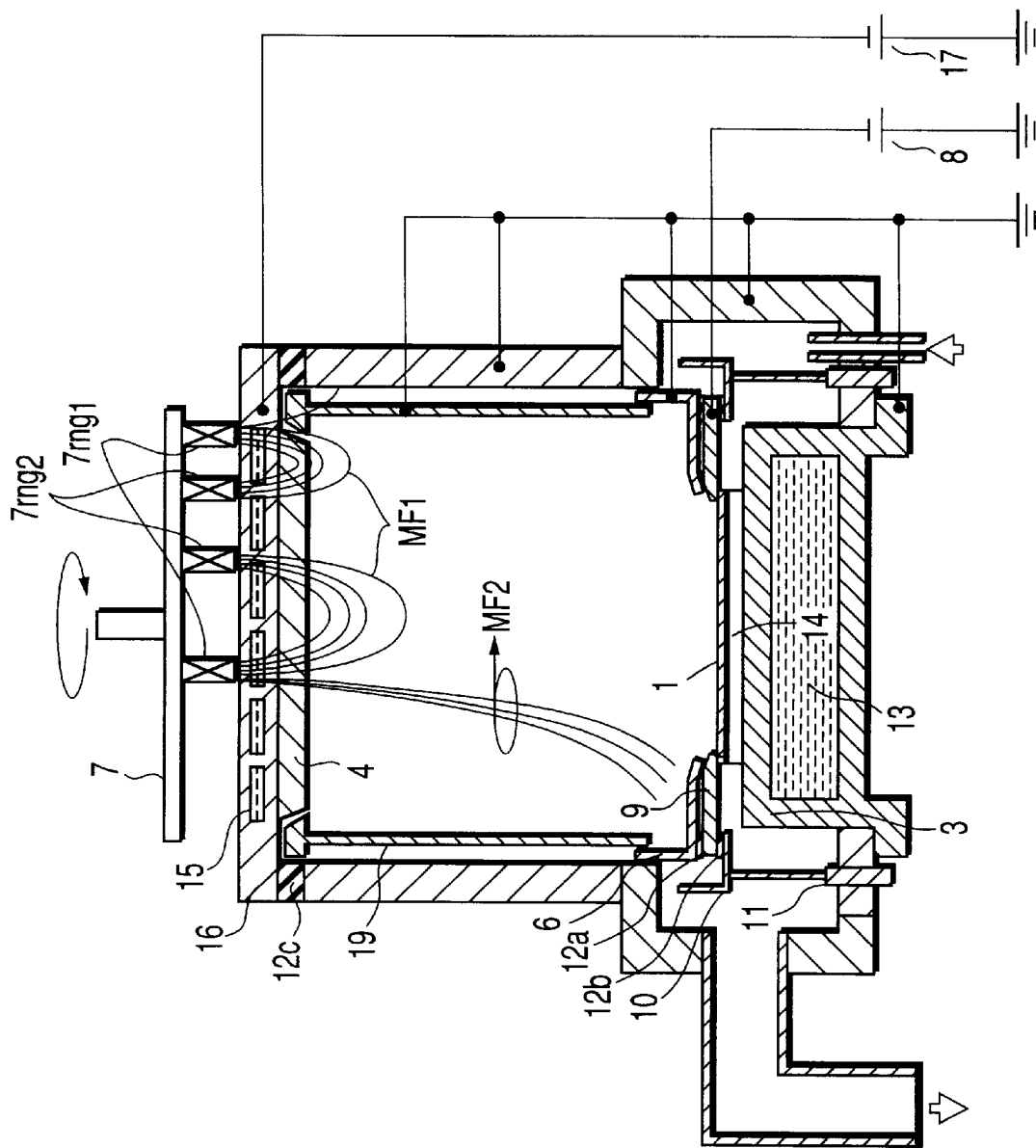
FIG. 8 is a view showing a sputtering apparatus using an unbalance magnet, and a magnetic field distribution formed by the unbalance magnet.

For example, as shown in FIG. 8, when ring-like magnets 7rng1 and 7rng2, in each of which the N pole has a higher magnetic density than that of the S pole, are used, a closed magnetic field MF1 formed by loop-like lines of magnetic force directed from the N poles to the S poles, and a divergent magnetic field MF2 formed by lines of magnetic force divergent from the N poles are formed. Electrons are trapped in the closed magnetic field MF1 directed from the N poles to the S poles to increase the plasma density near the target 4. The divergent magnetic field MF2 directed from the N poles serves to separate electrons in the plasma away from the target 4. When the magnetic flux densities and positions of the ring-like magnets 7rng1 and 7rng2 are adjusted, the divergent magnetic field MF2 extends toward or to the lower grounded component 6 of the process chamber 2.

The magnets constituting the unbalance magnet are not limited to those with ring-like shapes. Although the lower grounded component 6 is a grounded component provided in the lower portion of the process chamber 2, what matters is to provide a grounded component below the target 4, and a lower grounded component may be provided at the center in the process chamber 2.

Figure 9:
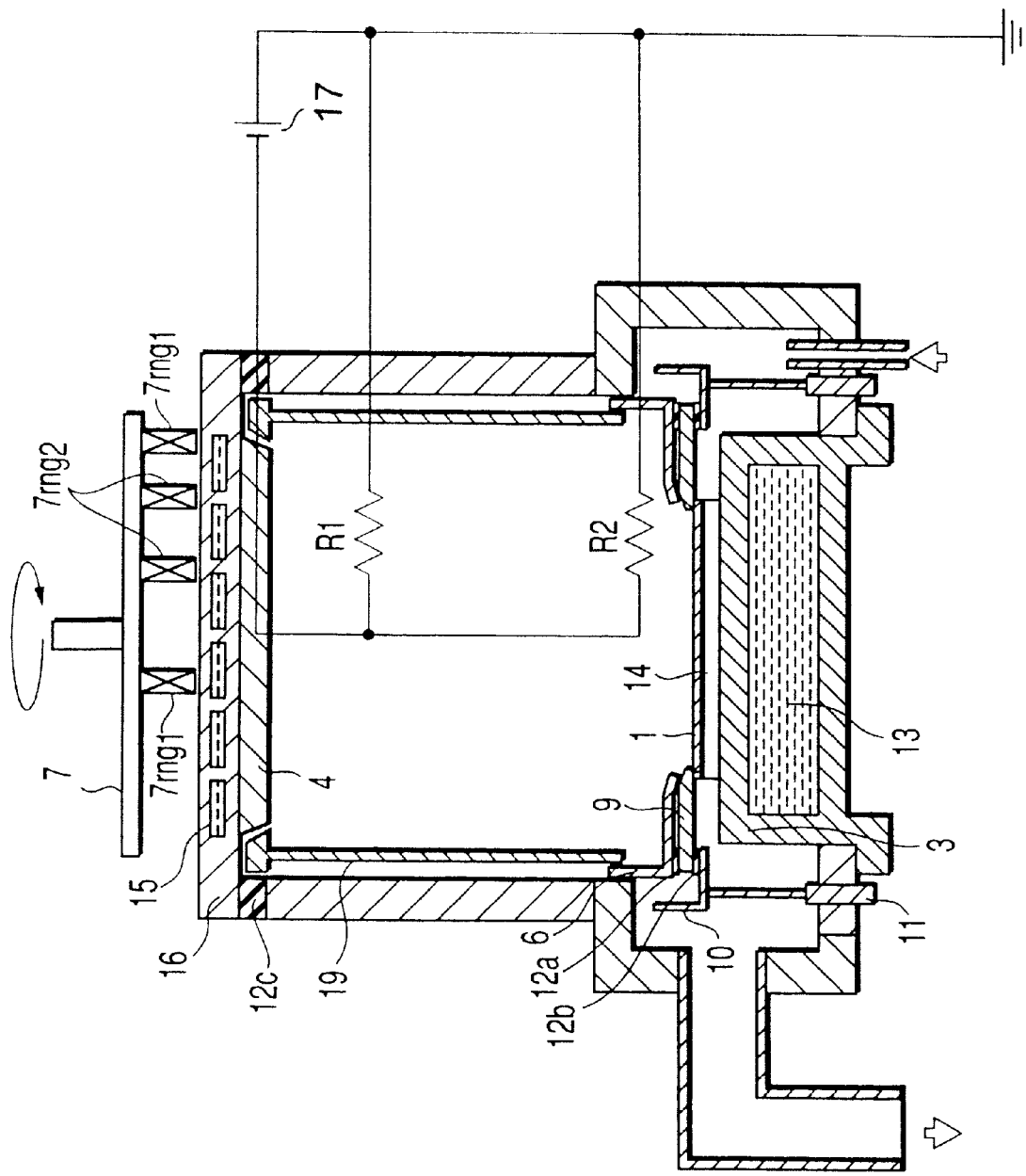
FIG. 9 is a view showing resistances between the target and a lower grounded component and between the target and a side grounded component of the sputtering apparatus shown in FIG. 8.

When glow discharge is caused by using this unbalance magnet, an electron distribution in which electrons are dense along the divergent magnetic field MF2 is formed in the process chamber 2. Therefore, as shown in FIG. 9, an electric resistance R2 (an electric resistance will merely be referred to as a resistance hereinafter) between the target 4 and lower grounded component 6 can be decreased by a resistance R1 between the target 4 and a side grounded component 19, and the anode can serve as a lower grounded component away from the target 4. Note that the side grounded component 19 corresponds to the ion reflecting plate 5 in a grounded state. In FIG. 9, the reference symbol 17 denotes a voltage applied between the target 4 and the grounded components 6 and 19.

Figure 10:
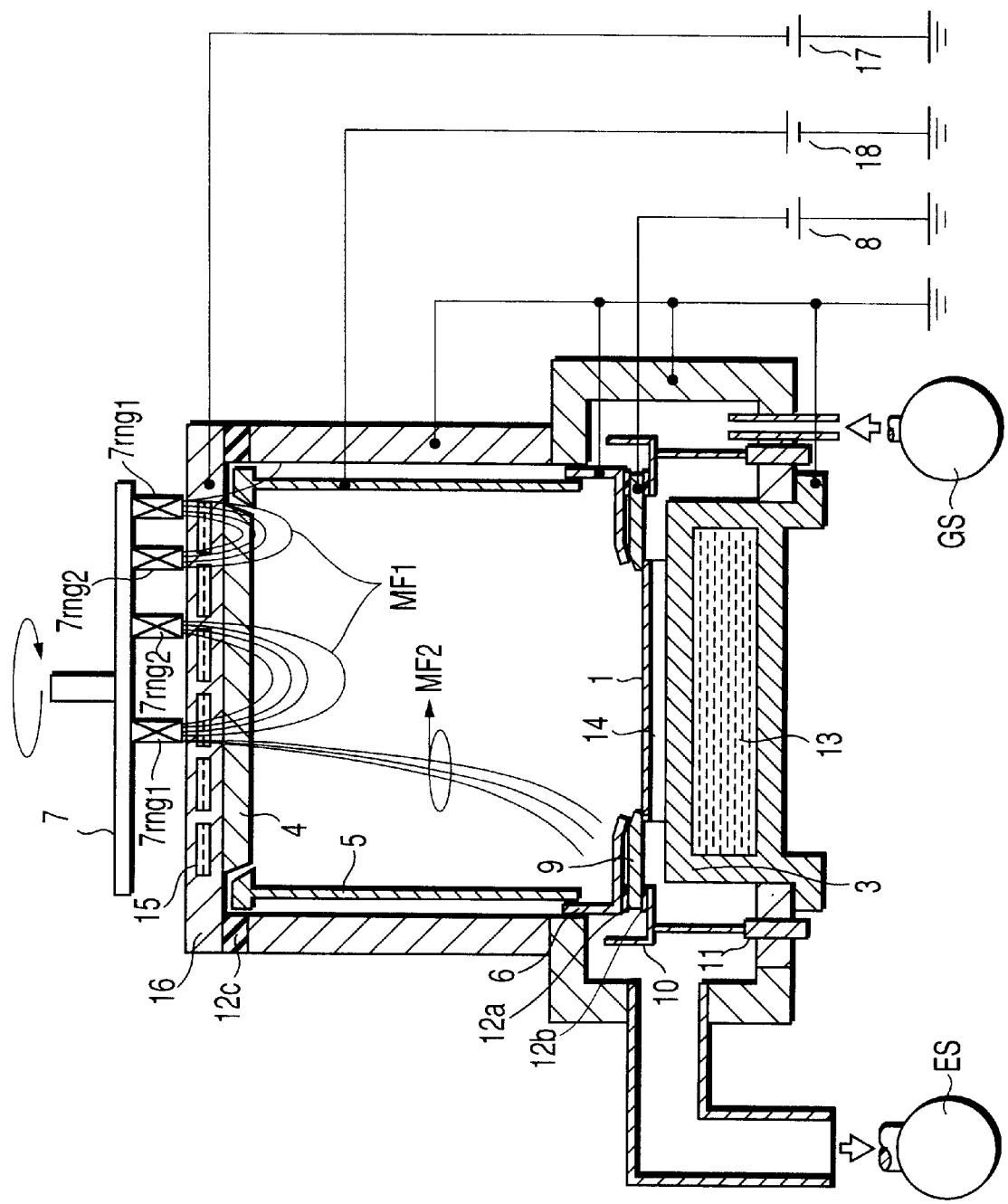
FIG. 10 is a view of a sputtering apparatus according to the present invention (the sixth modification of the first embodiment) which uses an unbalance magnet and an ion reflecting plate.
Figure 11:
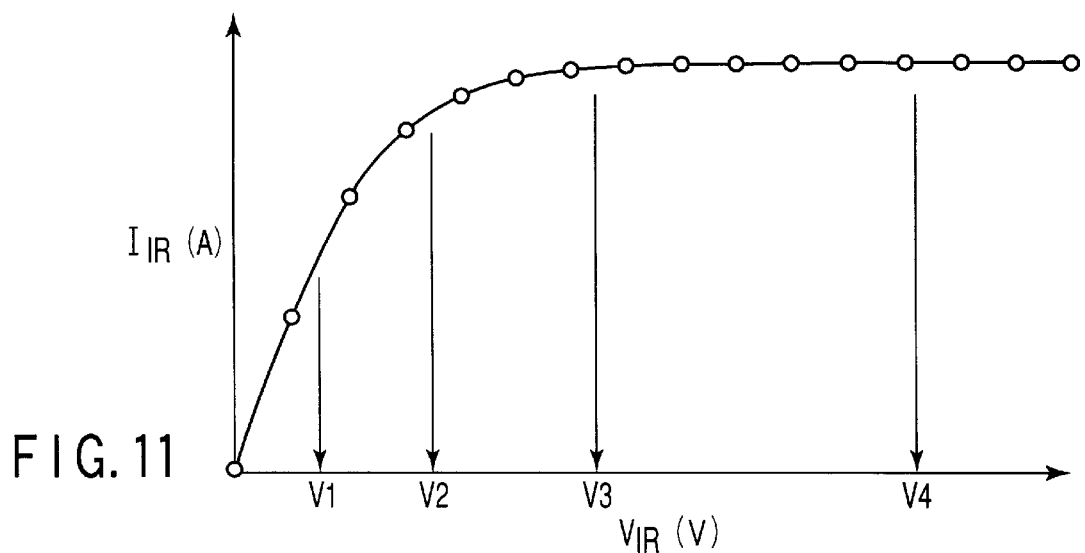
FIG. 11 is a graph showing the relationship between a voltage $V_{IR}$ to be applied to the ion reflecting plate and a current $I_{IR}$ flowing through the ion reflecting plate of the sputtering apparatus shown in FIG. 10.

FIG. 10 shows a sputtering apparatus according to the present invention which uses such an unbalance magnet and an ion reflecting plate. FIG. 11 shows a relationship between a voltage $V_{IR}$ to be applied to the ion reflecting plate and a current $I_{IR}$ flowing through the ion reflecting plate in this apparatus.

As the positive voltage to be applied to the ion reflecting plate 5 is increased, electrons in the plasma gradually flow through the ion reflecting plate 5 until they are eventually saturated. This is because electrons that have been flowing through the lower grounded component 6 due to the divergent magnetic field MF2 are attracted by the electrostatic force of the ion reflecting plate 5 and flow through the ion reflecting plate 5. Hence, even when an unbalance magnet is used, if a positive voltage is applied to the ion reflecting plate 5, the ion reflecting plate 5 eventually becomes an anode.

FIGS. 12A to 13B show transition of the potential distribution that occurs when a positive voltage is gradually applied to the ion reflecting plate 5, with reference to voltage values shown in FIG. 11.

Figures 12A, 12B:
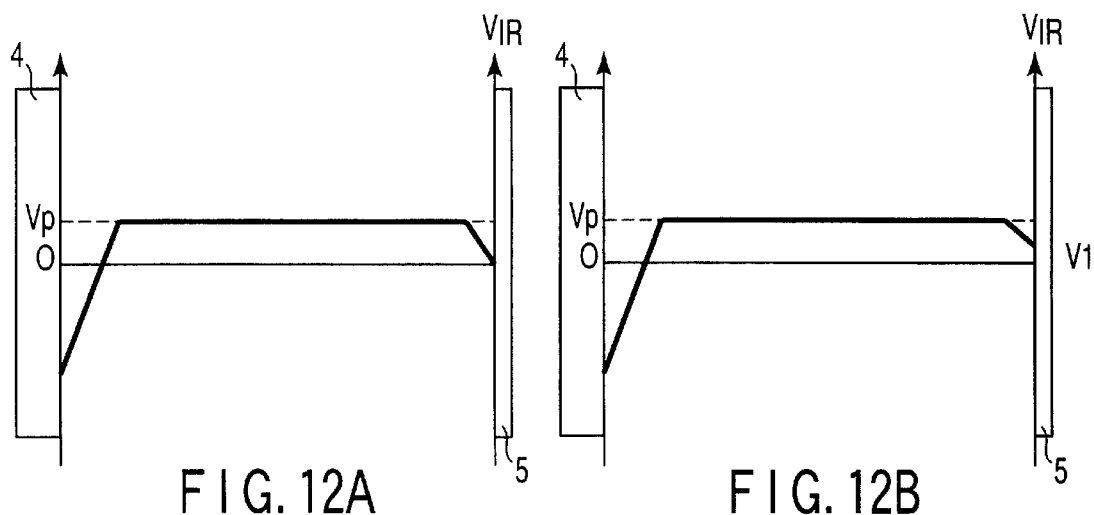
FIGS. 12A, 12B, and 12C are views showing transition of a potential distribution obtained when a positive voltage is gradually applied to the ion reflecting plate of the sputtering apparatus shown in FIG. 10.
Figure 12C:
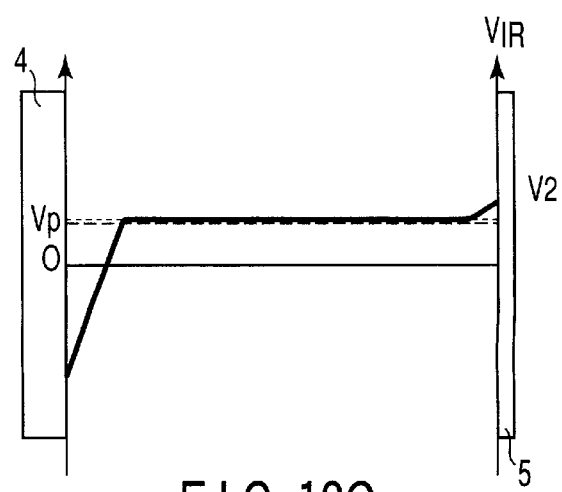

As shown in FIG. 12A, when the voltage ($V_{IR}$) to be applied to the ion reflecting plate 5 is 0V, the plasma potential Vp is equal to that shown in FIG. 7A. As shown in FIG. 12B, when the voltage $V_{IR}$ (=V1) is increased, the difference between the potential of the ion reflecting plate 5 and the plasma potential decreases. As shown in FIG. 12C, when the voltage $V_{IR}$ (=V2) is further increased, the potential of the ion reflecting plate 5 becomes higher than the plasma potential. At this stage, since the anode is still partly formed of the lower grounded component 6, the plasma potential Vp does not increase much, and an effective voltage (a voltage defined by (voltage $V_{IR}$ of the ion reflecting plate)−(plasma potential Vp) and having a value larger than 0) can be applied to the ion reflecting plate 5. As the difference between the potential of the ion reflecting plate 5 and the plasma potential, i.e., the electric field, increases gradually, the ion directionality can be changed to increase the number of ions reaching the substrate 1.

Figures 13A, 13B:
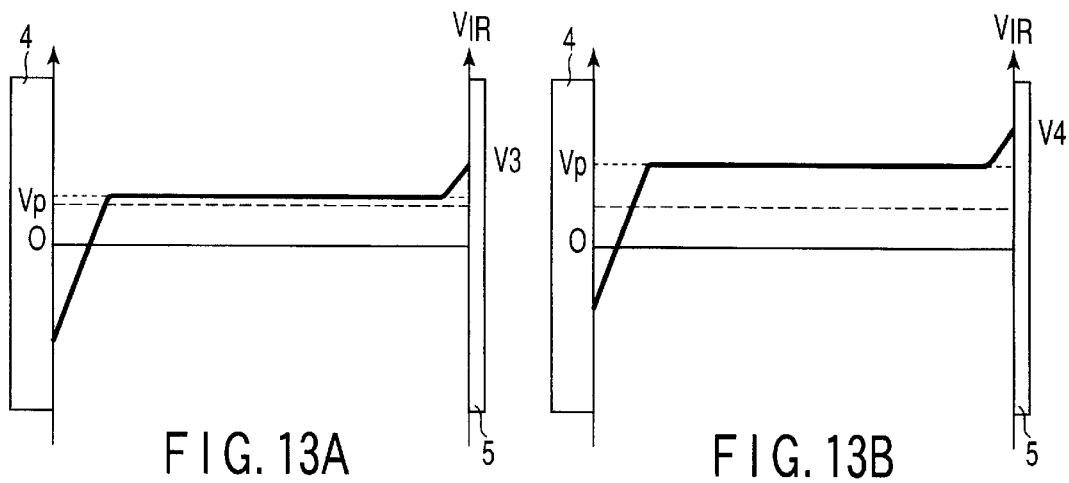
FIGS. 13A and 13B are views, following FIG. 12C, showing transition of the potential distribution.

As shown in FIG. 13A, when the voltage $V_{IR}$ (=V3) of the ion reflecting plate 5 is further increased, only the ion reflecting plate 5 becomes the anode. However, as shown in FIG. 13B, even when the voltage $V_{IR}$ (=V4) is increased to be higher than V3, the potential distribution is merely shifted in the positive direction together with the plasma potential Vp by an amount corresponding to this increase, and the electric field for changing the ion directionality does not increase. More specifically, as shown in FIGS. 11 and 17, as the voltage $V_{IR}$ of the ion reflecting plate 5 increases, a current $I_W$ (a current density $ID_W$ is shown in FIG. 17) of the substrate 1 also increases. Once the current flowing to the ion reflecting plate 5 is saturated, if the voltage $V_{IR}$ is increased, the current $I_W$ stays saturated.

Furthermore, according to the studies of the present inventors, it is apparent that, to suppress the film formation rate to a practically acceptable level and to increase the gathering ratio of ions to the substrate 1, the dimensions of the constituent components (the ion reflecting plate 5 includes a cylindrical portion at least partly) may be set to fall within the following predetermined ranges.

More specifically, the dimensions of the constituent components are set to satisfy $Da \leq Db \leq 5Da/2$, $3Da/4 \leq Dc \leq 5Da/2$, and $Db \leq Dd \leq 5Db/3$ where Da, Db, Dc, and Dd are the diameter of the substrate 1, the diameter of the target 4, the distance between the target 4 and substrate 1, and the inner diameter of the cylindrical portion of the ion reflecting plate 5, respectively. As a result, the geometric structure can suppress the film formation rate to a practically acceptable level, and the gathering ratio of ions to the substrate 1 can be increased effectively.

In this manner, if the inner diameter of the cylindrical ion reflecting plate 5 is up to 5/3 times the diameter of the target 4, the ion reflecting plate 5 can reflect ions effectively. This determines the upper limit of the inner diameter Dd of the cylindrical portion of the ion reflecting plate 5. The diameter Db of the target 4 is the diameter of that portion which is exposed to the plasma and does not include an overlaying portion covered with the earth shield 27 and ion reflecting plate 5. This relationship is established when a circular substrate 1 and circular target 4 are used. If a rectangular substrate and rectangular target are used, at least part of the ion reflecting plate 5 may form a quadrangular cylinder, and the long and short sides of the quadrangular cylinder may be fitted for Da, Db, and Dd to satisfy the above relationship. In this case, the short sides of the substrate may be fitted for the lower limit of Dc, and the long sides of the substrate may be fitted for the upper limit of Dc. If the substrate 1 is elliptic, at least part of the ion reflecting plate 5 may form an elliptic cylinder, and the major and minor axes of the elliptic cylinder may be similarly fitted for Da, Db, and Dd.

According to the experiment conducted by the present inventors, the length of the ion reflecting plate 5 is closely related to the probability with which electrons reach the substrate 1. As in the sputtering apparatus according to the present invention, if the magnetic field is controlled by an unbalance magnet, an effective voltage can be applied to the ion reflecting plate 5. Even if the number of neutral particles reaching the substrate 1 consequently is the same as that of the prior art, the number of ions reaching the substrate 1 becomes larger than that of the prior art.

The effective voltage to be applied to the ion reflecting plate 5 depends also on the length of the ion reflecting plate 5. This is because even when the divergent magnetic field MF2 of the unbalance magnet is adjusted to extend toward or to the lower grounded component 6, if the distance between the ion reflecting plate 5 and lower grounded component 6 is small, an effective voltage cannot be applied to the ion reflecting plate 5, and the ion reflecting plate 5 is undesirably coupled as the anode. If the length of the ion reflecting plate 5 is short, the inner surface area of the ion reflecting plate 5 (ion reflecting plate inner surface area) to which ions fly decreases, and the number of ions that can change the directionality decreases.

Figures 14A, 14B:
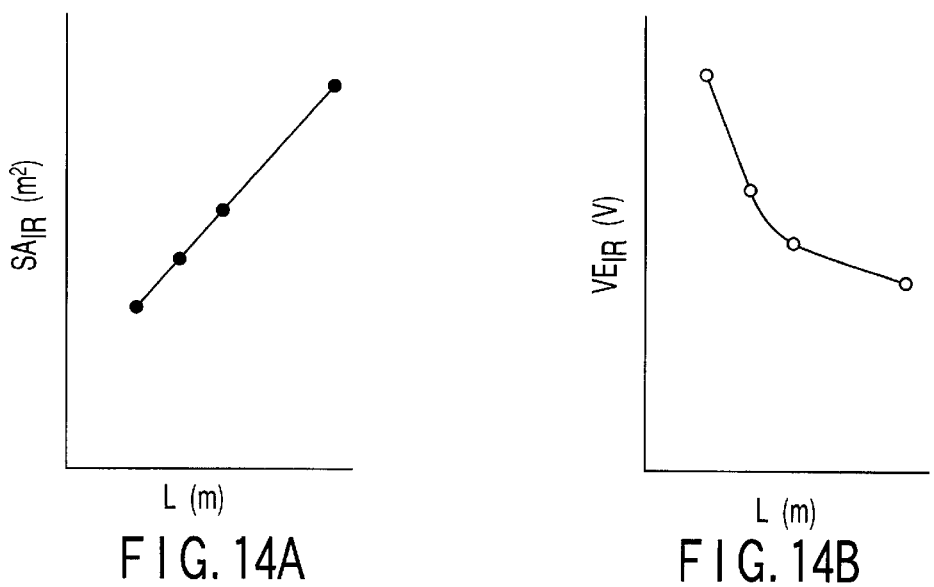
FIGS. 14A, 14B, and 14C are graphs showing the dependencies of an inner surface area $SA_{IR}$ of the ion reflecting plate, an effective voltage $VE_{IR}$ to be applied to the ion reflecting plate, and a substrate current $I_W$, respectively, on a length L of the ion reflecting plate.
Figure 14C:
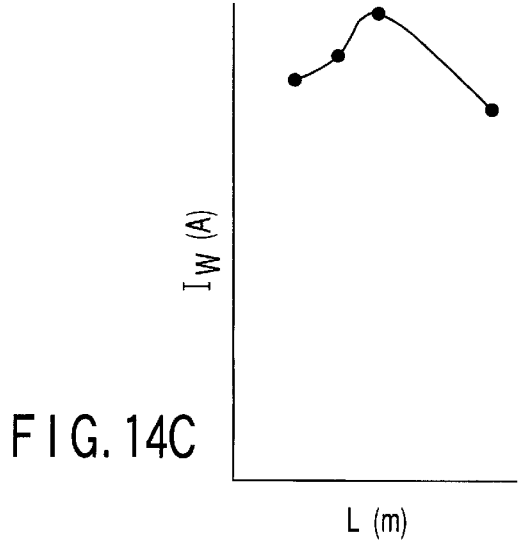

FIGS. 14A, 14B, and 14C show the dependencies of an inner surface area $SA_{IR}$ of the ion reflecting plate, an effective voltage $VE_{IR}$ to be applied to the ion reflecting plate (effective ion reflecting plate voltage), and a substrate current $I_W$, respectively, on a length L of the ion reflecting plate 5. As shown in FIGS. 14A, 14B, and 14C, as the length L of the ion reflecting plate increases, the inner surface area $SA_{IR}$ of the ion reflecting plate increases, while the effective ion reflecting plate voltage $VE_{IR}$ decreases inversely. Therefore, the substrate current $I_W$ decreases whether the length L of the ion reflecting plate is increased or decreased. In other words, the length L of the ion reflecting plate has an appropriate value that increases the substrate current $I_W$.

Furthermore, according to the extensive studies by the present inventors, when an ion reflecting plate 5 including a cylindrical portion is used, a substrate current can be increased effectively by satisfying an inequality $Dc/5 \leq L \leq 5DC/6$ where DC is the distance between the substrate and sputter target and L is the length of the ion reflecting plate. With this finding being combined with the previously obtained result, when an ion reflecting plate including a cylindrical portion is used, it is preferable to form the apparatus to satisfy $Da \leq Db \leq 5Da/2$, $3Da/4 \leq Dc \leq 5Da/2$, $Db \leq Dd \leq 5Db/3$, and $Dc/5 \leq L \leq 5Dc/6$.

The position of the ion reflecting plate 5 is preferably closer to the target 4. This is because ions of atoms, e.g., Cu, with a large mass number have directionality that is changed small by an electric field. Therefore, if the distance between the target 4 and substrate 1 is increased and the ion reflecting plate 5 is arranged near the target 4, even ions of an atom with a large mass number, i.e., ions with orbits that change small can reach the substrate 1.

The shape of the substrate 1 need not be strictly circular more specifically, a substrate (wafer) with an orientation flat or notch can be used. The shape of the target 4 suffices if its portion opposing the substrate 1 is circular.

(Second Embodiment)

In the second embodiment, a damascene process for a Cu interconnection, which uses the sputtering apparatus described in the first embodiment will be described. FIGS. 15A to 16C are sectional views showing the steps in the Cu interconnection process.

Figure 15A:
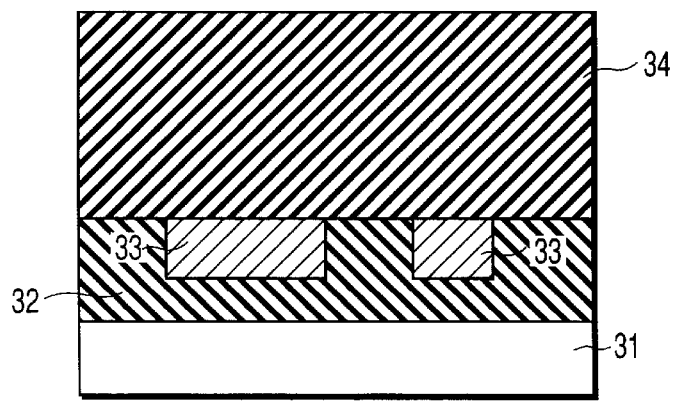
FIGS. 15A, 15B, and 15C are sectional views showing the steps in a DD process according to the second embodiment of the present invention.

As shown in FIG. 15A, a first interlevel insulating film 32, lower interconnections 33, and a second interlevel insulating film 34 are formed on an Si substrate 31. The lower interconnections 33 may be formed by the same damascene process for a Cu interconnection (upper interconnection) (to be described later), or by other methods. The lower interconnections 33 are Cu interconnections, Al interconnections, W interconnections, or the like.

Figure 15B:
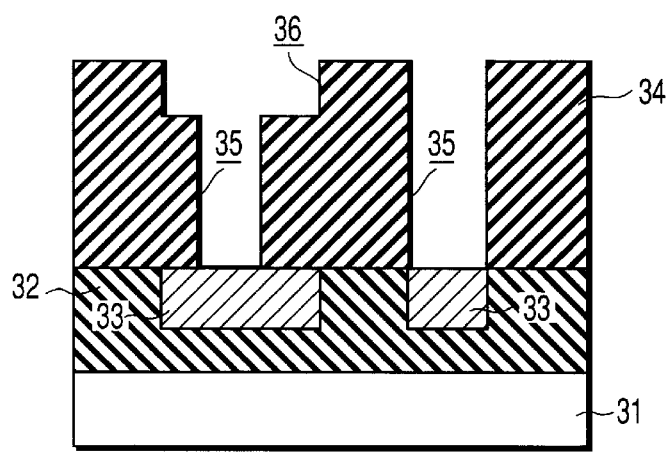
Figure 15C:
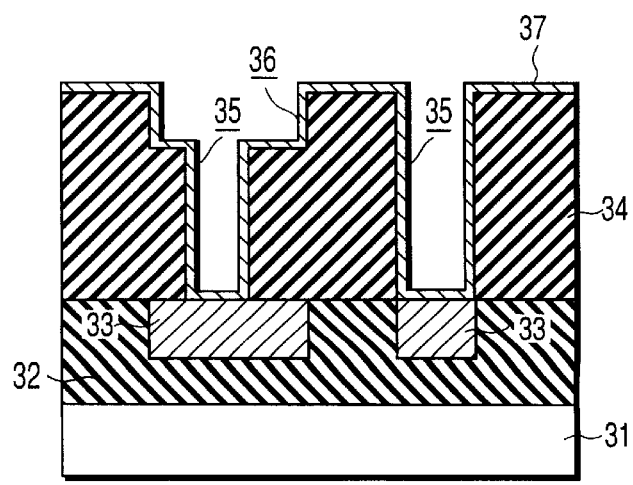

As shown in FIG. 15B, contact holes 35 to be connected to the lower interconnections 33, and an interconnection groove 36 are formed in the second interlevel insulating film 34. As shown in FIG. 15C, a barrier metal film 37 for preventing diffusion of Cu into the first and second interlevel insulating films 32 and 34 is formed on the inner surfaces of the contact holes 35 and interconnection groove 36. For example, the barrier metal film 37 is a single-layered TaN film, a multilayered Ta/TaN film, a multilayered TaN/Ta film, or a multilayered Ta/TaN/Ta film.

Figure 16A:
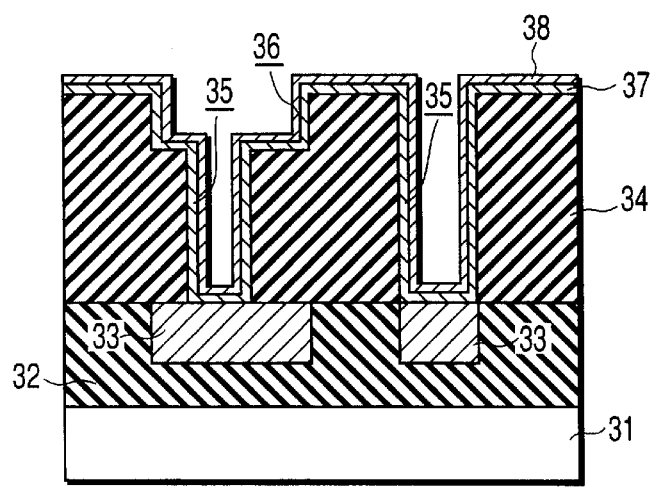
FIGS. 16A, 16B, and 16C are sectional views, following FIG. 15C, showing the steps in the DD process.
Figure 16B:
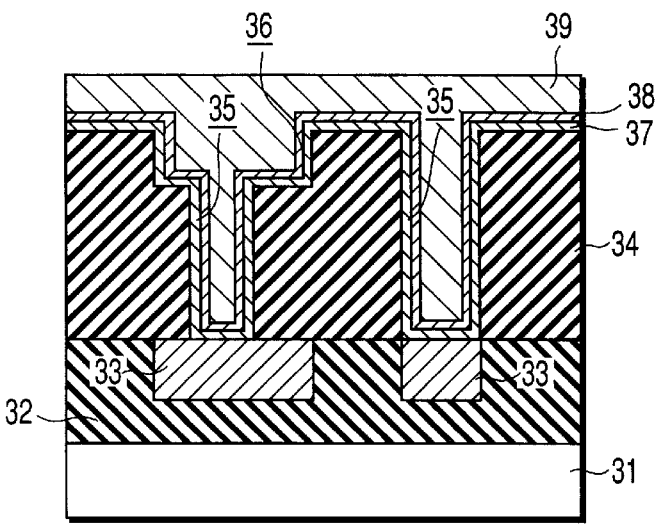
Figure 16C:
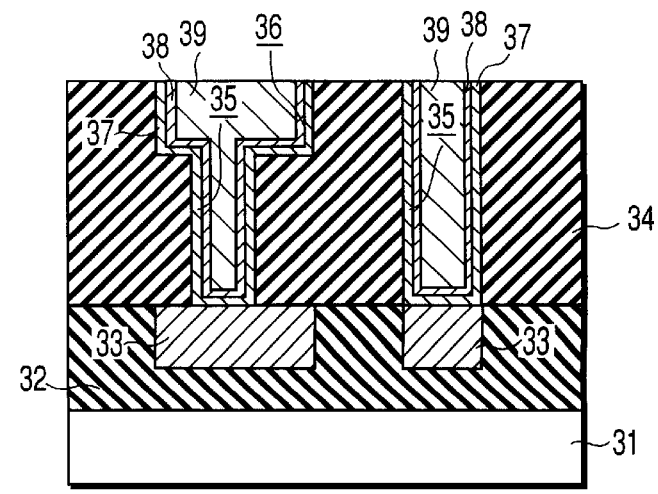

As shown in FIG. 16A, a Cu seed layer 38 for Cu electroplating is formed on the barrier metal film 37 by using the sputtering apparatus described in the first embodiment. After that, as shown in FIG. 16B, a Cu film 39 is formed on the entire surface by Cu electroplating to fill the contact holes 35 and interconnection groove 36. As shown in FIG. 16C, the Cu film 39 outside the contact holes 35 and interconnection groove 36 is removed by CMP, thus completing the DD interconnection of Cu.

In this embodiment, the Cu seed layer is formed by using the sputtering apparatus of the present invention, and the interconnection groove and the like are buried by Cu electroplating afterwards. Alternatively, a Cu film may be formed by using the sputtering apparatus of the present invention, and the interconnection groove and the like may be buried by reflow of Cu in a heating process afterwards.

The present invention may be applied to the first Cu film of the 2-step reflow scheme which is divided into formation of the first Cu film and formation of the second Cu film. Furthermore, the present invention may be applied to a Cu seed layer for Cu-CVD. The present invention may be applied, other than the DD interconnection, to a Cu single damascene (SD) interconnection formed by burying only a groove, or to a Cu plug formed by burying only a contact hole.

The step of forming the Cu seed layer 38 of FIG. 16A, to which the present invention is applied, will be described in detail.

First, a transfer system incorporated in a cluster tool transfers in vacuum the Si substrate 31 to the sputtering apparatus shown in FIG. 1. The Si substrate 31 is transferred onto a susceptor 3 cooled with a coolant 13, and a support 10 is moved downward to cause a clamp 9 and Si substrate 31 to come into contact with each other. A voltage is applied to an electrostatic chucking plate 14 to cause the Si substrate 31 and susceptor 3 to come into tight contact with each other.

Ar is supplied as a sputter gas into the process chamber 2 by a gas supply system GS. A positive voltage is applied to an ion reflecting plate 5, and simultaneously a negative voltage is applied to a target 4 to cause discharge, thereby generating an Ar gas plasma. Supply of the Ar gas is stopped, and a first DC voltage source 8 applies a DC negative voltage to the Si substrate 31 through the clamp 9.

In the conventional sputtering apparatus, many sputtering particles obliquely come incident on the surface of the Si substrate 31, and the step coverage is accordingly low. In contrast to this, as in this embodiment, if a negative voltage is applied to the Si substrate 31 to attract positively charged Cu ions vertically to the surface of the substrate, the directivity can be improved, and the step coverage can be improved.

When Ar gas is supplied in the sputter process, Ar ions exist in addition to Cu ions. Therefore, when a negative voltage is applied to the Si substrate 31, Ar ions are also vertically attracted to the surface of the substrate 31 to physically etch the Cu seed layer 38 formed on the Si substrate 31. When Ar ions physically etch the Cu seed layer 38, physically etched Cu attaches to the inner surfaces of the contact holes 35 again, so that the thickness of the Cu seed layer 38 on the side surfaces of the contact holes 35 can be increased.

In conventional sputtering, the number of Cu particles coming incident on the bottom surfaces of the contact holes 35 is originally small. If the supply amount of Ar is increased, the physical etching rate of Cu by Ar ions exceeds the deposition rate of Cu, and sometimes no Cu seed layer 38 is formed on the bottom surfaces of the contact holes 35.

Ar ions accelerated by the negative voltage applied to the Si substrate 31 generate heat upon collision against the substrate. If the amount of Ar is large, it undesirably increases the substrate temperature. Cu is a material that tends to agglomerate. When the substrate temperature increases, Cu does not form a film but is separated into islands. When the process is used to form the Cu seed layer 38 for Cu electroplating, the Cu film agglomeration causes problems in that the openings of the contact holes 35 are closed, or the Cu seed layer 38 may be separated to lose electrical contact.

When a large amount of Ar gas is supplied, Ar is mixed into the Cu seed layer 38 to degrade the film quality. Ar taken into the Cu seed layer 38 suppresses crystal growth to degrade the reliability of the Cu interconnection. To remove Ar in the Cu seed layer 38 by annealing, a high temperature is needed. Then, a problem of Cu diffusion into the first and second interlevel insulating films 32 and 34 and into the Si substrate 31 arises.

In the second embodiment, after Ar is supplied to cause discharge, supply of Ar is stopped, and discharge by only Cu ions is sustained. If the voltage and current of the Cu target and the magnetic field conditions are adjusted, even when Ar gas is stopped, self-plasma can be sustained easily.

In the second embodiment, the nature of Cu that it causes self-sustained discharge easily is utilized to eliminate the adverse influence of Ar gas as much as possible. In other words, if supply of Ar gas is stopped, the adverse influence of physical etching by Ar ions and temperature increase can be eliminated thereafter, and only Cu ions can be attracted to the Si substrate 31 with good directivity.

During self-sustained plasma, a high-density plasma region is formed on the surface of the Cu target by a magnetic field. This is because electrons trapped by the magnetic field ionize Cu. At this time, the plasma is separated into a high-density plasma region near the target which is comprised of Cu ions restrained by the magnetic field and the target voltage, and a low-density plasma region comprised of free Cu ions and away from the target.

When a negative voltage with a smaller absolute value than that for the target 4 is applied to the Si substrate 31, Cu ions in the high-density plasma region are restrained by the negative voltage of the target 4 and accordingly cannot be attracted to the Si substrate 31. Inversely, when a negative voltage with a larger absolute value than that for the target 4 is applied to the Si substrate 31, although Cu ions in the high-density plasma region are extracted, conditions for self-sustained discharge which are determined by the voltage and current of the target 4 and the magnetic field conditions cannot be satisfied, so that discharge is interrupted.

More specifically, Cu ions that can be attracted to the Si substrate 31 are mainly free Cu ions in the low-density plasma region. Thus, to sustain self-plasma, the negative voltage to be applied to the Si substrate 31 must be adjusted within a range appropriate for this.

However, the number of Cu ions in the low-density plasma region is small, and the ratio of the amount of Cu ions contributing to film formation to the amount of neutral Cu particles is low. Accordingly, Cu ions do not have an effect enough to act on the shape of the formed film. In the conventional sputtering apparatus in which the region to be exposed to the plasma is a grounded shield plate, most of Cu ions free in the low-density plasma region are adsorbed by the grounded component, and the number of ions attracted to the Si substrate 31 accordingly decreases.

In contrast to this, in the sputtering apparatus of the present invention, the region to be exposed to the plasma is the ion reflecting plate 5 to which a positive voltage is applied. Positively charged Cu ions can be reflected by the ion reflecting plate 5 and be gathered on the Si substrate 31, to which a negative voltage is applied, at a high gathering ratio.

FIG. 17 shows an example of a substrate current density $ID_W$ (a value obtained by dividing a current flowing through the substrate by the substrate surface area) which is obtained when a voltage $V_{IR}$ to be applied to the ion reflecting plate 5 is increased. The larger the ion reflecting plate voltage $VE_{IR}$, the larger the substrate current density $ID_W$. In Cu self-sustained sputtering, ions that are attracted to the substrate upon application of a negative voltage are only Cu ions, and the current flowing through the substrate is a Cu ion current. More specifically, an increase in substrate current density corresponds to an increase in number of Cu ions coming incident on the substrate. When a positive voltage is applied to the ion reflecting plate, the number of Cu ions with the directivity can be increased, thereby improving the step coverage.

According to the studies of the present inventors, to improve the step coverage of a Cu film formed on a substrate by the effect of Cu ions, the substrate current density obtained with Cu ions must be adjusted to 4.5 mA/cm$^2$ or more, and the film formation rate must be adjusted to 10 nm/s or less.

As in this embodiment, when a negative voltage is applied to the Si substrate 31 and the ion reflecting plate 5 to which a positive voltage is applied is provided to a region to be exposed to a plasma, the number of Cu ions that can be attracted to the Si substrate 31 can be increased, and the Cu seed layer 38 can be formed on the entire inner surfaces (side surfaces and bottom surfaces) of the contact holes 35 and interconnection groove 36 with a good coverage. Also, since a temperature increase caused by Ar is small, Cu does not agglomerate, so that electric conduction for Cu electroplating afterwards can be sufficiently ensured.

The reason why the step coverage is improved when Cu ions are attracted to the substrate will be described with reference to FIGS. 18A, 18B, and 18C.

As shown in FIG. 18A, since Cu ions 52 vertically come incident on the substrate surface upon application of a negative voltage (substrate negative voltage) to the substrate, a Cu film can be formed on the bottom surface of a contact hole 51. Reference numeral 53 denotes neutral Cu particles.

As shown in FIG. 18B, when the negative voltage to be applied to the substrate is adjusted, the Cu ions 52 physically etch a Cu film 54 formed on the bottom surface of the contact hole 51. Cu which is accordingly forced out attaches to the side surface of the bottom of the contact hole 51 again, thereby increasing the thickness of the Cu film on the side surface of the bottom of the contact hole 51.

As shown in FIG. 18B, the neutral Cu particles coming obliquely incident form an overhang 55 on the opening of the contact hole 51. Cu ions sputter the overhang 55 again to physically etch it. Etched Cu attaches to the side surface of the contact hole 51 again to increase the thickness of the Cu film on the side surface of the contact hole 51.

As shown in FIG. 18C, when etching of the overhang 55 progresses, the prospective incident angle of the sputtering particles increases, so that the number of particles 53 coming incident on the interior of the contact hole 51 increases.

A method of adjusting the coverage amounts on the side and bottom surfaces of the contact hole by using the sputtering apparatus of the present invention will be described. Regarding this method, the following experiment was conducted.

Figure 19A:
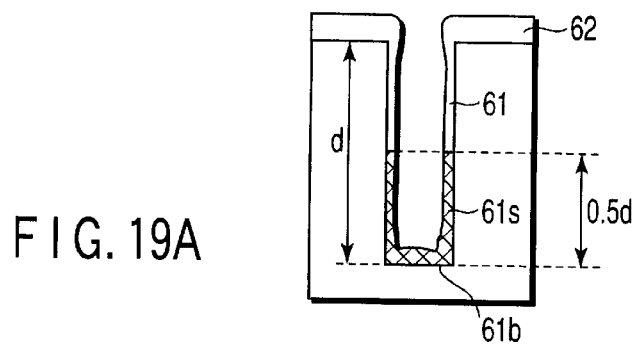
FIG. 19A is a view showing an experiment in which sputtering film formation was performed by using the voltage $V_{IR}$ of the ion reflecting plate as a parameter.

First, sputtering film formation was performed by using the voltage $V_{IR}$ of the ion reflecting plate 5 as a parameter. The effective substrate voltage $VE_W$ (the difference between the plasma potential and substrate potential) was set to a constant value of −185V. As shown in FIG. 19A, a Cu film 62 on the flat portion outside a contact hole 61 was set to have a thickness of 100 nm with respect to the opening diameter of 0.25 μm and the depth of 0.85 μm of the contact hole 61. A total amount Mbs of an amount Mb of Cu covering a bottom surface 61*b* of the contact hole 61 and an amount Ms of Cu covering a side surface 61*s* of the contact hole 61 to half a depth d from the bottom surface 61*b* was measured.

Figure 19B:
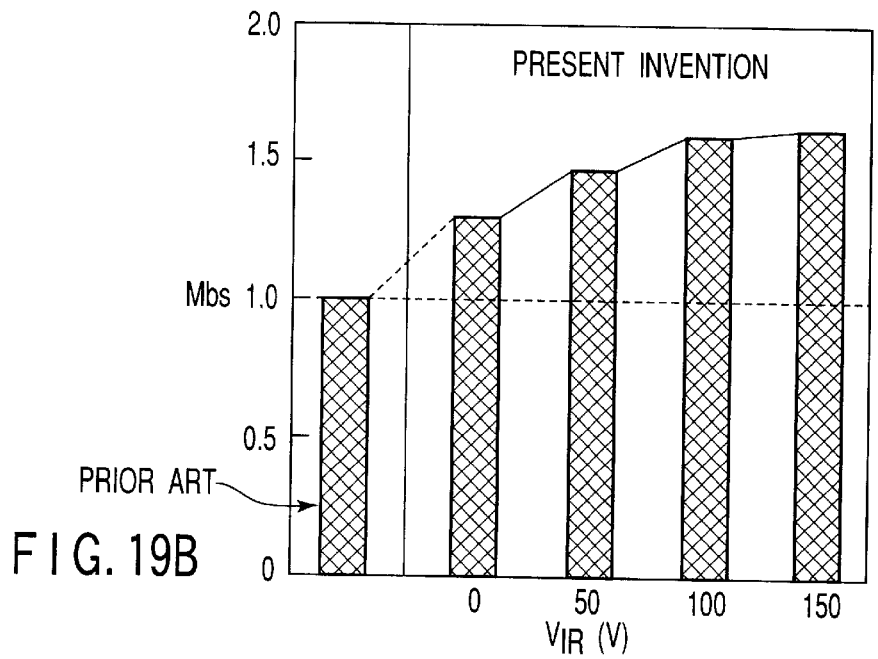
FIGS. 19B and 19C are graphs showing the relationship between a total amount Mbs of bottom-side Cu and the voltage $V_{IR}$ at the central portion and the end portion, respectively, of the substrate.
Figure 19C:
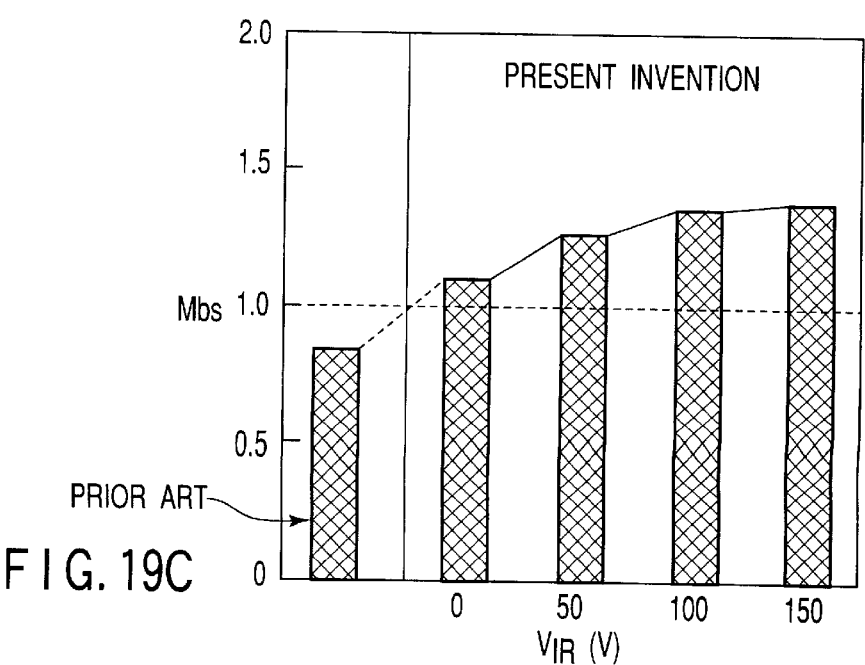

FIGS. 19B and 19C show the relationship between the total amount Mbs of bottom-side Cu and the voltage $V_{IR}$ of the ion reflecting plate 5 at the central portion and the end portion, respectively, of the substrate. Referring to FIGS. 19B and 19C, the total amount Mbs is normalized by the Cu amount at the central portion of the substrate which is formed by using a long throw sputtering apparatus as a conventional sputtering apparatus.

As shown by the bar graphs of FIGS. 19B and 19C, even when the voltage $V_{IR}$ is zero, the total amount Mbs is larger than that obtained by using the conventional sputtering apparatus. To a certain extent, as the voltage $V_{IR}$ increases, the total amount Mbs of bottom-side Cu increases. When the voltage $V_{IR}$ is 100V or more, the ion reflecting plate 5 becomes an anode, as described above, and the total amount Mbs does not increase very much. Therefore, the voltage $V_{IR}$ is desirably adjusted to such a degree that the ion reflecting plate 5 does not become an anode.

Figure 20A:
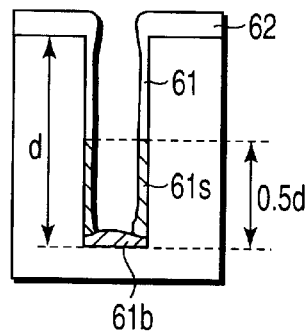
FIG. 20A is a view showing an experiment in which sputtering film formation was performed by using the effective substrate voltage $VE_W$ as a parameter.

Subsequently, sputtering film formation was performed by using the effective substrate voltage $VE_W$ (the difference between the plasma potential and substrate potential) as a parameter. The ion reflecting plate voltage $V_{IR}$ was set to a constant value of 100V. As shown in FIG. 20A, the Cu film 62 on the flat portion outside the contact hole 61 was set to have a thickness of 100 nm with respect to the opening diameter of 0.25 μm and the depth of 0.85 μm of the contact hole 61. The amount Mb of Cu covering the bottom surface 61*b* of the contact hole 61 and the amount Ms of Cu covering the side surface 61*s* of the contact hole 61 to half the depth d from the bottom surface 61*b* were measured separately, and their total amount Mbs was calculated.

Figure 20B:
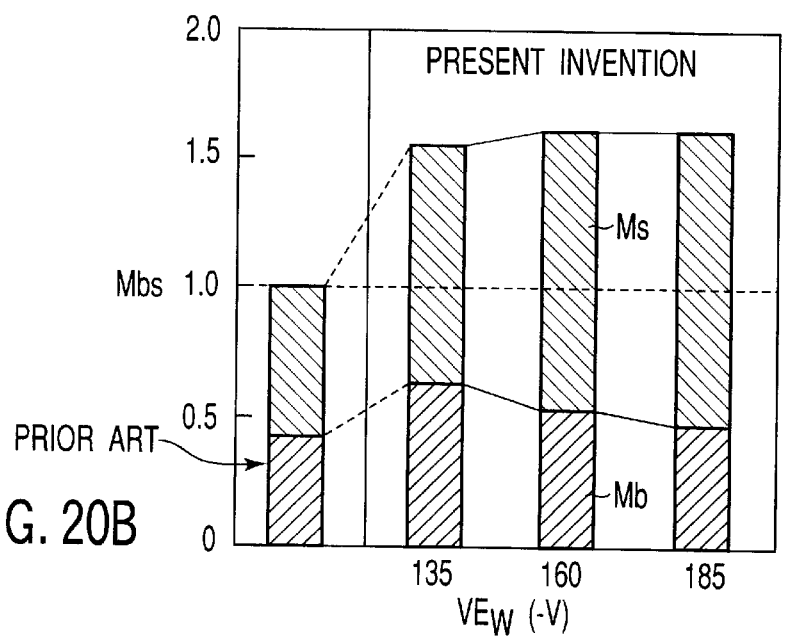
FIGS. 20B and 20C are graphs showing the relationship among an amount Mb of bottom-surface Cu, an amount Ms of side-surface Cu, the total amount Mbs of bottom-side Cu, and the voltage $VE_W$ at the central portion and the end portion, respectively, of the substrate.
Figure 20C:
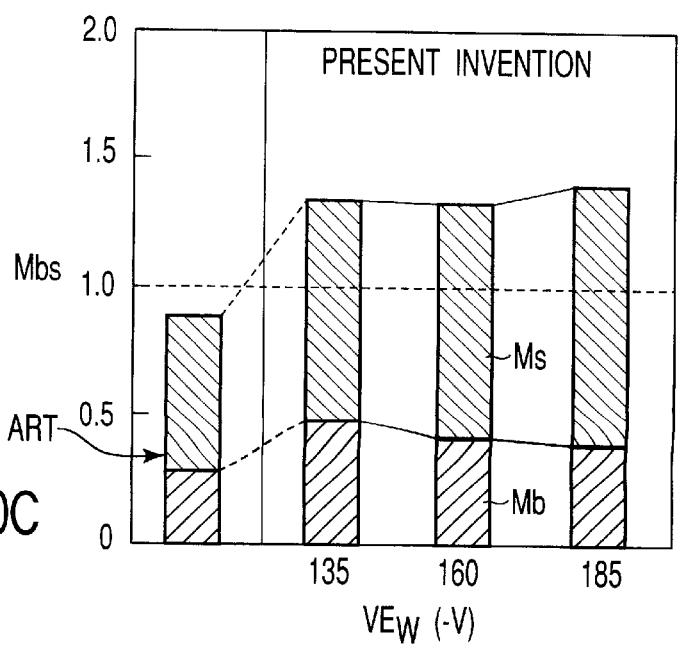

FIGS. 20B and 20C show the relationship among the amount Mb of bottom-surface Cu, the amount Ms of side-surface Cu, the total amount Mbs of bottom-side Cu, and the effective substrate voltage $VE_W$ at the central portion and the end portion, respectively, of the substrate. Referring to FIGS. 20B and 20C, the amounts Mb, Ms, and Mbs are normalized by the Cu amount at the central portion of the substrate which is formed by using the long throw sputtering apparatus as a conventional sputtering apparatus.

As shown by the bar graphs of FIGS. 20B and 20C, even when the absolute value of the effective substrate voltage $VE_W$ increases, the total amount Mbs does not increase very much. More specifically, to increase the total amount Mbs, it is effective to adjust the voltage $V_{IR}$ of the ion reflecting plate 5 as a parameter. Also, from FIGS. 20B and 20C, the larger the absolute value of the effective substrate voltage $VE_W$, the smaller the amount Mb of bottom-surface Cu, and the larger the amount Ms of side-surface Cu. This is because Cu on the bottom surface of the contact hole is physically etched by ions to attach to the side surface of the bottom of the contact hole again, as described above with reference to FIGS. 18A, 18B, and 18C. In other words, the ratio of the amount Mb of bottom-surface Cu to the amount Ms of side-surface Cu can be adjusted by the effective substrate voltage $VE_W$.

This principle applies to other materials. For example, with Cu as the plating seed which is significant to cover the entire inner surface of a recess, TaN or TiN as the material of the barrier metal, TiN as the material of a glue layer for W-CVD, or the like, it is better to increase the absolute value of the effective substrate voltage so that the film thickness on the bottom surface and that on the side surface of the bottom are adjusted to be close to each other. With a refractory metal, such as Ti or Co, which causes a silicide reaction with Si to decrease the contact resistance, it is better to decrease the absolute value of the effective substrate voltage so that the thickness of the film on the bottom surface is increased.

Figure 21A:
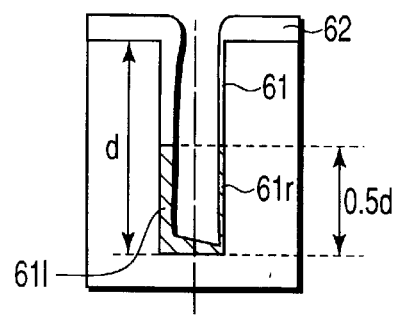
FIG. 21A is a view showing an experiment in which sputtering film formation was performed with reference to a symmetry index SYM by using the voltage $V_{IR}$ of the ion reflecting plate and the effective substrate voltage $VE_W$ as parameters.

Subsequently, using the voltage $V_{IR}$ of the ion reflecting plate 5 and the effective substrate voltage $VE_W$ as parameters, sputtering film formation was performed concerning a symmetry index SYM (a difference in Cu amount between the right and left side surfaces near the bottom of the contact hole). When the ion reflecting plate voltage $V_{IR}$ was used as the parameter, the effective substrate voltage $VE_W$ was set to a constant value of −185V. When the effective substrate voltage $VE_W$ was used as the parameter, the ion reflecting plate voltage $V_{IR}$ was set to a constant value of 100V. As shown in FIG. 21A, the Cu film 62 on the flat portion outside the contact hole 61 was set to have a thickness of 100 nm with respect to the opening diameter of 0.25 $\mu$m and the depth of 0.85 $\mu$m of the contact hole 61. Amounts Mr and Ml of Cu respectively covering right and left side surfaces 61r and 61l of the contact hole 61 to half the depth d from the bottom surface 61b were measured separately, and the symmetry index SYM=Ml/Mr was calculated.

Figure 21B:
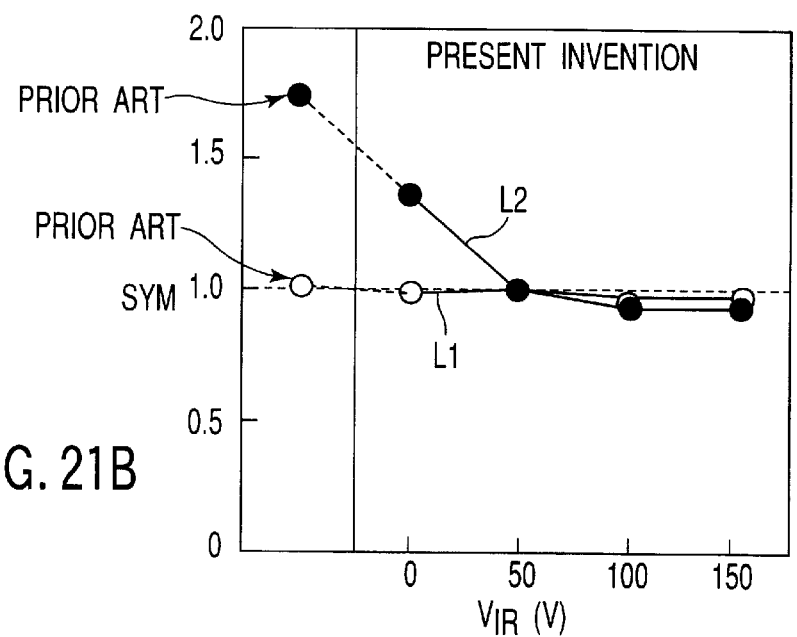
FIGS. 21B and 21C are graphs respectively showing the relationship between the symmetry index SYM and the voltage $VE_{IR}$, and the relationship between the symmetry index SYM and the voltage $VE_W$, which are the result of this experiment.
Figure 21C:
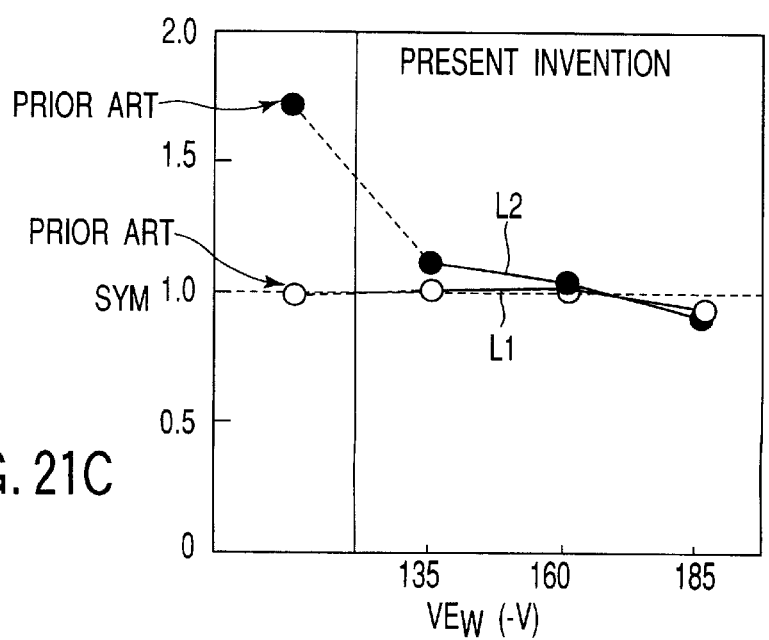

FIGS. 21B and 21C show the relationship between the symmetry index SYM and the ion reflecting plate voltage $VE_{IR}$, and between the symmetry index SYM and the effective substrate voltage $VE_W$. Referring to FIGS. 21B and 21C, reference numerals L1 and L2 denote the characteristics at the central portion and the end, respectively, of the substrate.

In many sputtering apparatuses, the step coverage of the deposited film becomes asymmetric at the end of the substrate. Particularly, in a long throw sputtering apparatus with a target and substrate being away from each other, this asymmetry becomes conspicuous. In the sputtering apparatus of present invention as well, the distance between the target and substrate is large. In the experiment, this distance was uniformed to 300 mm.

As shown in FIG. 21B, in the sputtering apparatus of the present invention, when the ion reflecting plate voltage $V_{IR}$ is 0V, the step coverage of L2 stays asymmetric. When the voltage $V_{IR}$ is 50V or more, the step coverage is almost symmetric. Furthermore, as shown in FIG. 21C, when the effective substrate voltage $VE_W$ is −135V, the Cu amount on the right side surface increases, and when the effective substrate voltage $VE_W$ is −185V, the Cu amount on the left side surface increases. This is because Cu on the right side surface, which is physically etched by ions, attaches to the left side surface again. In other words, when the effective substrate voltage is adjusted by using the sputtering apparatus of the present invention, a symmetric film can be formed.

When an effective voltage (a voltage that satisfies (the potential of the ion reflecting plate)−(plasma potential)>0) is applied to the ion reflecting plate 5, positive ions are repulsed by the positive potential and are pushed back to the plasma. In other words, reflected ions come incident on the cathode (target 4) as well. The cathode negative voltage holds positive ions in a number necessary for sustaining discharge near the cathode. However, since reflected ions directly come incident on the target 4, discharge can be sustained even if the absolute value of the cathode negative voltage is decreased.

The film formation rate is determined by the number of ions and the electric field between the target and plasma, and the larger the number of ions and the electric field, the higher the film formation rate. Namely, when the ion reflecting plate 5 is used, the absolute value of the cathode voltage can be decreased. Even if the number of ions colliding against the target 4 is maintained at the same value, the film formation rate can be prevented from becoming excessively high. During film formation, when the positive voltage to be applied to the ion reflecting plate 5 or the negative voltage to be applied to the substrate 1 is adjusted, step coverage can be controlled more effectively.

When Ar is supplied during film formation to adjust the amount of physical etching, the thickness of the film on the inner surface of the contact hole with a desired aspect ratio can be adjusted. A gas, e.g., He or $H_2$, with a small mass number may be supplied. Since an atom with a small mass number has a low physical etching capability, not only physical etching of the bottom of the contact hole can be suppressed, but also discharge can be stabilized even with a low power with which self-sustained discharge tends to be unstable.

(Third Embodiment)

In the third embodiment, a method of forming a Ti film by using the sputtering apparatus described in the first embodiment will be described.

Ti is a material widely used in semiconductor devices. In the third embodiment, a method of forming a contact hole in an interlevel insulating film formed on a substrate and forming a thick Ti film on the bottom surface of the contact hole will be described.

A sample obtained by forming an interlevel insulating film with a contact hole on a substrate is prepared. This sample is transferred in vacuum to the sputtering apparatus with the susceptor structure shown in FIG. 4 described in the first embodiment. The sample is transferred onto an upper member 26 heated by heater electrodes 25. A voltage is applied to electrostatic chucking electrodes 22 so that the sample comes into tight contact with the upper member 26 and is heated by the heater electrodes 25.

Ar is supplied as a sputter gas by a gas supply mechanism into a process chamber 2. A positive voltage is applied to an ion reflecting plate 5, and a negative voltage is applied to a target 4 to cause discharge. Then, an RF power is applied to the sample.

In the third embodiment, since the substrate surface is covered with the interlevel insulating film, the RF power is introduced to the substrate through a matching unit 21, so that a self DC negative voltage is induced in the substrate, as described above. Therefore, the same effect as that in the second embodiment in which a DC negative voltage is directly applied to the substrate by using the clamp 9 can be obtained. At this time, the DC negative voltage to be induced in the substrate can be adjusted by adjusting the RF power.

With Ti, different from the case with Cu described in the second embodiment, a high target voltage and current, and a high magnetic flux density on the target surface are necessary to sustain self-discharge.

To maintain such a high target voltage and current, a power supply with a large output is necessary. To obtain a high magnetic flux density, a large magnet is necessary. Accordingly, to realize a sputtering apparatus that can sustain self-discharge of Ti requires a high apparatus cost.

In the third embodiment, a small amount of Ar is supplied to stabilize discharge with an inexpensive sputtering apparatus. In this case, when Ar is adjusted to a minimum amount that can sustain stable discharge and the target current density is adjusted to 20 mA/cm$^2$ or more, the ratio of ions produced from the target material to Ar ions can be increased. Therefore, the step coverage can be improved by applying a negative voltage to the substrate to attract ions produced from the target material to the substrate.

As described above, when the target current density is increased, the film formation rate increases, and a Ti thin film is difficult to form with good controllability. However, as also described in the second embodiment, with the sputtering apparatus of the present invention using the ion reflecting plate, the positive voltage applied to the ion reflecting plate allows the target voltage to be reduced. In other words, even if the target current density is adjusted to increase Ti ions, the film formation rate can be adjusted to a controllable range by decreasing the target voltage.

As in this embodiment, if Ar is supplied in the minimum amount that can sustain stable discharge, physical etching of the Ti film on the substrate can be suppressed. Furthermore, when sputtering is performed by heating the substrate 1, as in this embodiment, a temperature increase upon collision of Ar ions against the substrate does not cause an adverse influence. In the film formation process, since the substrate 1 is heated, Ar is discharged from the Ti film. Thus, the amount of Ar remaining in the Ti film is suppressed to a low level.

As described in the second embodiment, the plasma is separated into a high-density plasma region comprised of Ti ions and Ar ions restrained near the Ti target, and a low-density plasma region comprised of free Ti ions and Ar ions. Most of Ti ions attracted by the substrate negative voltage are Ti ions in the low-density plasma region. However, the numbers of Ti ions and Ar ions in the low-density plasma region are small, and the ratio of Ti ions to neutral Ti particles contributing to film formation is low. Therefore, the effect of Ti ions on the shape of the formed film is not sufficiently high. Furthermore, with the conventional sputtering apparatus in which the region to be exposed to the plasma is a grounded deposition preventive plate, most of Ti ions free in the low-plasma region are adsorbed by the grounded component, and the number of ions attracted to the substrate is small.

As in the third embodiment, when the ion reflecting plate 5 applied with the positive voltage is provided, positively charged Ti ions can be reflected by the ion reflecting plate 5 and be gathered on the Si substrate 1, applied with a negative voltage, at a high gathering ratio. In other words, as in this embodiment, when the ion reflecting plate 5 applied with a positive voltage is provided to a region which is exposed to a plasma, and the substrate 1 is applied with a negative voltage, the number of Ti ions to be attracted to the substrate 1 can be increased.

At this time, as described above, the current density of the target 4 is set to 20 mA/cm$^2$ or more to increase the number of Ti ions in the plasma. Simultaneously, the Ar supply amount and the substrate negative voltage are adjusted so that the effect of physical etching of the Ti film on the substrate 1 decreases. Hence, the thickness of the Ti film on the bottom surface of the contact hole can be increased. When the positive voltage to be applied to the ion reflecting plate and the substrate negative voltage are adjusted during film formation, the step coverage can be controlled more effectively.

During film formation, if the Ar supply amount is increased and the physical etching amount is adjusted, the thickness of the film on the inner surface of the contact hole with a desired aspect ratio can be controlled. In place of Ar, a light element such as $H_2$ or He may be supplied into the process chamber 2. Since $H_2$ or He has a small mass number, the sputter yield with respect to an atom such as Ti with a large mass number is low. Therefore, physical etching of the Ti film on the substrate can be suppressed, and since a light atom such as $H_2$ or He has a small kinetic energy, an increase in substrate temperature upon collision against the substrate can be suppressed. By supplying $H_2$ or He, stability of discharge can be ensured. In particular, $H_2$ is an active gas that contributes to ionization of Ti. The ratio of Ti ions to Ti neutral atoms on the substrate surface can thus be increased.

In the third embodiment, sputter formation of the Ti film has been described. The present invention can also be applied to sputter formation of a single atom film containing Al, Nb, Ta, W or the like as the main component, and also to sputter formation of a film made of a plurality of elements such as AlCu, AlSiCu, and the like.

(Fourth Embodiment)

In the fourth embodiment, a method of forming a TaN film to serve as a barrier metal film in the DD interconnection process (see FIGS. 15A to 16C) of Cu by using the sputtering apparatus described in the first embodiment will be described.

To prevent Cu in a Cu interconnection from diffusing into an interlevel insulating film through the bottom and side surfaces of an interconnection groove and contact hole, the TaN film used as the barrier metal film for Cu is desirably formed on all the inner surfaces of the interconnection groove and contact hole with good step coverage. How to form a TaN film that can satisfy this requirement will be described.

A first interlevel insulating film 32, lower interconnections 33, and a second interlevel insulating film 34 with an interconnection groove 36 and contact holes 35 are formed on an Si substrate 31 in the same manner as in the second embodiment (see FIGS. 15A and 15B).

The substrate 31 is transferred in vacuum to the sputtering apparatus of the present invention. In this embodiment, to form a TaN film while heating, so the stress of the TaN film is decreased, the sputtering apparatus with the susceptor structure shown in FIG. 4 is used. The substrate 31 is transferred onto an upper member 26 heated by heater electrodes 25, and a voltage is applied to electrostatic chucking electrodes 22, so that the substrate 31 comes into tight contact with the upper member 26 and the substrate 31 is heated by the heater electrodes 25.

Ar and $N_2$ are supplied into a process chamber 2 as a sputter gas and a reaction gas, respectively, by a gas supply mechanism. A positive voltage is applied to an ion reflecting plate 5. A negative voltage is applied to a target 4 to cause discharge. An RF power is applied to the substrate 31.

In this embodiment, since the surface of the substrate 31 is covered with the interlevel insulating films 32 and 34, an RF power from an RF power supply 20 is introduced to the substrate 31 through a matching unit 21. In this case, a self DC negative voltage is induced in the substrate 31. Therefore, an effect of attracting positive ions to the substrate can be obtained, in the same manner as in the second embodiment in which a DC negative voltage is applied to the substrate by using the clamp 9. At this time, when the RF power is adjusted, the DC negative voltage to be induced in the substrate 31 can be adjusted.

With the TaN film, since reactive sputter in which a Ta target is used and $N_2$ is supplied as the reaction gas is employed, self-sustained sputtering cannot be performed, different from the case of Cu sputtering described in the second embodiment. In the fourth embodiment, a gas mixture of Ar and $N_2$ is supplied after it is adjusted to the minimum value that can sustain stable discharge. In this manner, when a necessary minimum amount of gas mixture of Ar and $N_2$ is supplied and the target current density is increased, the ratio of Ta ions and the ratio of Ta—N ions in which Ta and N are combined can be increased. Therefore, Ta ions and Ta—N ions can be attracted to the substrate by the substrate negative voltage, thereby improving the step coverage.

When the target current density is increased, the film formation rate may become excessively high. However, as also described in the second and third embodiments, with the sputtering apparatus of the present invention using the ion reflecting plate, the positive voltage applied to the ion reflecting plate allows the target voltage to be reduced. Thus, the film formation rate can be adjusted to a controllable range by decreasing the target voltage.

In reactive sputter in which $N_2$ is supplied to the conventional sputtering apparatus wherein the region to be exposed to the plasma is a grounded deposition preventive plate, most of Ta ions, Ta—N ions, and N ions free in the low-density plasma region are adsorbed by the grounded component, and the number of ions attracted to the substrate accordingly decreases. As in the sputtering apparatus of the present invention, when the ion reflecting plate 5 to which a positive voltage is applied is provided, positively charged ions are reflected by the ion reflecting plate 5, so that ions can be gathered to the substrate, to which a negative voltage is applied, with a good gathering ratio. In particular, with reactive sputter using the sputtering apparatus of the present invention, different from conventional reactive sputter, N ions can also be gathered to the substrate at a good gathering ratio, so that the barrier performance can be improved.

Reactive sputter includes two modes, i.e., the poison mode in which the target surface is nitrided with $N_2$ supplied to it, and Ta—N is sputtered, thereby forming a film, and the non-poison mode in which Ta sputter particles produced from the target material are nitrided on the substrate while forming a film.

Generally, although the poison mode has good barrier performance, it has poor step coverage. Inversely, although the non-poison mode has poor barrier performance, it has good step coverage. The poison mode has poor step coverage due to the following reason. In order to nitride the target, a large amount of $N_2$ must be supplied. Then, the influence of gas scattering increases, and the vertical incident components of the sputter particles decrease. The non-poison mode has a low barrier performance because nitridation on the substrate surface is not insufficient.

When the sputtering apparatus of the present invention is used, N ions to be attracted to the substrate by the negative voltage of the ion reflecting plate 5 and the substrate can be increased, so that many N ions can collide against the surface of TaN formed on the substrate. Therefore, even when the $N_2$ supply amount is decreased to decrease the influence of gas scattering, the substrate surface can be nitrided sufficiently. In other words, the ion reflecting plate 5 can increase not only the numbers of Ta ions and Ta—N ions to improve the step coverage, but also the barrier performance.

When the positive voltage to be applied to the ion reflecting plate 5, or the substrate negative voltage is adjusted during film formation, the step coverage and barrier performance can be controlled more effectively. When the supply amounts of Ar and $N_2$ are increased during film formation to adjust the physical etching amount and the nitriding amount, the thickness and barrier performance of the film formed on the inner surface of the contact hole with a desired aspect ratio can be controlled.

In the fourth embodiment, chemical sputter film formation of TaN is described. If a target made of a material such as Ti, W, or Nb is used and $N_2$ is supplied, chemical sputter film formation of TiN, WN, NbN, or the like can be performed in the same manner. If a target made of a material such as Ta is used and $O_2$ is supplied, chemical sputtering of TaO or the like can be performed in the same manner.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A sputtering apparatus comprising:

a vacuum process chamber configured to accommodate a substrate to be processed;

a support member configured to support the substrate in said process chamber;

a gas supply system configured to supply a process gas into said process chamber;

an exciting system configured to excite the process gas to generate a plasma by causing discharge in said process chamber;

a sputter target disposed in said process chamber so as to oppose the substrate and to be collided by ions in the plasma to emit a film forming material;

a first negative biasing section configured to apply a first negative potential to said target;

a second negative biasing section configured to apply a second negative potential to the substrate;

an ion reflecting plate disposed in said process chamber so as to surround a space between the substrate and said target;

a positive biasing section configured to apply a positive potential to said ion reflecting plate;

a conductive component disposed in said process chamber to form a path along which electrons are released from the plasma; and a magnetic field forming system configured to form in said process chamber a closed magnetic field for trapping electrons in the plasma on a surface of said target and a divergent magnetic field for directing the electrons in the plasma to said conductive component.

2. The apparatus according to claim 1, wherein said conductive component is grounded.

3. The apparatus according to claim 1, wherein said conductive component is disposed between said ion reflecting plate and the substrate.

4. The apparatus according to claim 1, wherein said closed magnetic field has a line of magnetic force that forms a loop on said surface of said target, and said divergent magnetic field has a line of magnetic force extending from said surface of said target to said conductive component.

5. The apparatus according to claim 4, wherein said magnetic field forming system has first and second magnets disposed behind said target, said first and second magnets being arranged such that S and N poles thereof are directed to said target and having different magnetic flux densities.

6. The apparatus according to claim 1, wherein said magnetic field forming system is set such that an electric resistance between said target and said ion reflecting plate is higher than that between said target and said conductive component when the plasma is formed and said ion reflecting plate and said conductive component are grounded.

7. The apparatus according to claim 1, wherein said ion reflecting plate includes a cylindrical portion, and inequalities $Da \leq Db \leq 5Da/2$, $3Da/4 \leq Dc \leq 5Da/2$, and $Db \leq Dd \leq Db/3$ are satisfied where Da, Db, Dc, and Dd are a diameter of the substrate, a diameter of said target, a distance between the substrate and said target, and an inner diameter of said cylindrical portion of said ion reflecting plate, respectively.

8. The apparatus according to claim 7, wherein an inequality $Dc/5 \leq L \leq 5Dc/6$ is further satisfied where L is a length of said ion reflecting plate.

9. The apparatus according to claim 1, wherein said first negative biasing section and said exciting system share a power supply.

10. The apparatus according to claim 1, further comprising a grounded shield interposed between said target and said ion reflecting plate.

11. The apparatus according to claim 1, wherein said support member has a worktable for placing the substrate thereon, and a conductive clamp for fixing the substrate on said worktable, and said second negative biasing section has a power supply connected to said clamp.

12. The apparatus according to claim 1, wherein said support member has a conductive worktable for placing the substrate thereon, and said second negative biasing section has an RF power supply connected to said worktable.

13. The apparatus according to claim 1, wherein said support member has a conductive support plate for placing the substrate thereon, and said second negative biasing section has a pulse DC power supply connected to said worktable.

14. The apparatus according to claim 1, wherein said ion reflecting plate has a plurality of separated plate members, and said positive biasing section has a plurality of power supplies respectively connected to said plate members.

15. A film forming method using said apparatus according to claim 1, comprising the steps of:

accommodating the substrate to be processed in said process chamber and supporting the substrate on said support member;

supplying the process gas into said process chamber;

applying the positive potential to said ion reflecting plate so that the ions of a film forming material are reflected and guided to the substrate;

exciting the process gas to generate the plasma by causing discharge in said process chamber;

applying the first negative potential to said target so that ions in the plasma collide against said target to emit the film forming material;

exciting said film forming material with the electrons in the plasma trapped by said closed magnetic field to ionize at least part of the film forming material;

flowing the electrons in the plasma with said divergent magnetic field to said conductive component and releasing the electrons from said process chamber through said conductive component, so that said conductive component serves as an anode with respect to said target; and forming a film on the substrate with the film forming material while attracting the ions of the film forming material to the substrate by applying the second negative potential to the substrate.

16. The method according to claim 15, further comprising a step of stopping supply of the process gas after causing the discharge, and self-sustaining the discharge with the ions of the film forming material.

17. A sputtering apparatus comprising:

a vacuum process chamber configured to accommodate a substrate to be processed;

a support member configured to support the substrate in said process chamber;

a gas supply system configured to supply a process gas into said process chamber;

an exciting system configured to excite the process gas to generate a plasma by causing discharge in said process chamber;

a sputter target disposed in said process chamber so as to oppose the substrate and to be collided by ions in the plasma to emit a film forming material;

a first negative biasing section configured to apply a first negative potential to said target;

a second negative biasing section configured to apply a second negative potential to the substrate;

an ion reflecting plate disposed in said process chamber so as to surround a space between the substrate and said target;

a positive biasing section configured to apply a positive potential to said ion reflecting plate;

a conductive component disposed in said process chamber to form a path along which electrons are released from the plasma; and a control mechanism configured to set an electric resistance between said target and said ion reflecting plate to be higher than that between said target and said conductive component when the plasma is formed and said ion reflecting plate and said conductive component are grounded.

18. The apparatus according to claim 17, wherein said ion reflecting plate includes a cylindrical portion, and inequalities $Da \leq Db \leq 5Da/2$, $3Da/4 \leq Dc \leq 5Da/2$, and $Db \leq Dd \leq Db/3$ are satisfied where Da, Db, Dc, and Dd are a diameter of the substrate, a diameter of said target, a distance between the substrate and said target, and an inner diameter of said cylindrical portion of said ion reflecting plate, respectively.

19. The apparatus according to claim 18, wherein an inequality $Dc/5 \leq L \leq 5Dc/6$ is further satisfied where L is a length of said ion reflecting plate.

20. The apparatus according to claim 17, wherein said control mechanism has first and second magnets disposed behind said target, said first and second magnets being arranged such that S and N poles thereof are directed to said target, having different magnetic flux densities, and configured to form in said process chamber a closed magnetic field for trapping electrons in the plasma on a surface of said target and a divergent magnetic field for directing the electrons in the plasma to said conductive component.

* * * * *